US011275315B2

United States Patent
Ghosh et al.

(10) Patent No.: US 11,275,315 B2
(45) Date of Patent: Mar. 15, 2022

(54) HIGH-PRECISION SHADOW-MASK-DEPOSITION SYSTEM AND METHOD THEREFOR

(71) Applicant: eMagin Corporation, Hopewell Junction, NY (US)

(72) Inventors: Amalkumar P. Ghosh, Hopewell Junction, NY (US); Fridrich Vazan, Pittsford, NY (US); Munisamy Anandan, Austin, TX (US); Evan Donoghue, Hopewell Junction, NY (US); Ilyas I. Khayrullin, Hopewell Junction, NY (US); Tariq Ali, Hopewell Junction, NY (US); Kerry Tice, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 15/655,544

(22) Filed: Jul. 20, 2017

(65) Prior Publication Data

US 2017/0342543 A1 Nov. 30, 2017

Related U.S. Application Data

(63) Continuation of application No. 15/602,939, filed on May 23, 2017, which is a continuation of application
(Continued)

(51) Int. Cl.
*G03F 7/20* (2006.01)
*C23C 14/04* (2006.01)
(Continued)

(52) U.S. Cl.
CPC ............ *G03F 7/707* (2013.01); *C23C 14/042* (2013.01); *C23C 14/30* (2013.01); *C23C 14/50* (2013.01); *C23C 14/54* (2013.01)

(58) Field of Classification Search
CPC .............................. G03F 7/707; C23C 14/042
See application file for complete search history.

(56) References Cited

U.S. PATENT DOCUMENTS

| 4,393,131 A | 7/1983 | Whalin et al. |
| 4,902,377 A | 2/1990 | Berglund et al. |

(Continued)

FOREIGN PATENT DOCUMENTS

| CN | 1461234 A | 12/2003 |
| CN | 1522098 A | 8/2004 |

(Continued)

OTHER PUBLICATIONS

Hyung-Joon Shin et al, "Patterning of ferroelectric nanodot arrays using a silicon nitride shadow mask"; http://adsabs.harvard.edu/abs/2005ApPhL..87k3114S, "Applied Physics Letters", Sep. 2005, vol. 87, No. Issue 11, id. 113114, Publisher: American Institute of Physics, Published in: KR.

(Continued)

Primary Examiner — Keath T Chen
(74) Attorney, Agent, or Firm — Kaplan Breyer Schwarz, LLP

(57) ABSTRACT

A direct-deposition system forming a high-resolution pattern of material on a substrate is disclosed. Vaporized atoms from an evaporation source pass through a pattern of through-holes in a shadow mask to deposit on the substrate in the desired pattern. The shadow mask is held in a mask chuck that enables the shadow mask and substrate to be separated by a distance that can be less than ten microns. Prior to reaching the shadow mask, vaporized atoms pass through a collimator that operates as a spatial filter that blocks any atoms not travelling along directions that are nearly normal to the substrate surface. Vaporized atoms that pass through the shadow mask exhibit little or no lateral spread after passing through through-holes and the material deposits on
(Continued)

Cross-Section Through Line b-b the substrate in a pattern that has very high fidelity with the through-hole pattern of the shadow mask.

30 Claims, 11 Drawing Sheets

Related U.S. Application Data

No. 15/597,635, filed on May 17, 2017, now Pat. No. 10,072,328.

(60) Provisional application No. 62/340,793, filed on May 24, 2016.

(51) Int. Cl.
*C23C 14/30* (2006.01)
*C23C 14/50* (2006.01)
*C23C 14/54* (2006.01)

(56) References Cited

U.S. PATENT DOCUMENTS

| | | | | |
|---|---|---|---|---|
| 5,013,275 A * | 5/1991 | Kautz | | B23K 26/24 219/121.63 |
| 5,847,813 A * | 12/1998 | Hirayanagi | | G03F 7/70433 355/75 |
| 5,854,819 A * | 12/1998 | Hara | | G03F 7/707 378/34 |
| 6,069,931 A | 5/2000 | Miyachi et al. | | |
| 6,084,938 A * | 7/2000 | Hara | | G03F 7/70708 269/8 |
| 6,287,436 B1 | 9/2001 | Pelletier et al. | | |
| 6,433,346 B1 * | 8/2002 | Hirayanagi | | H01L 21/6833 250/492.2 |
| 7,282,240 B1 | 10/2007 | Jackman et al. | | |
| 7,615,161 B2 | 11/2009 | Hoffman | | |
| 7,977,868 B2 | 7/2011 | Shieh et al. | | |
| 8,673,077 B2 | 3/2014 | Sonoda et al. | | |
| 8,742,658 B2 | 6/2014 | Yu et al. | | |
| 8,879,766 B1 | 11/2014 | Zhang | | |
| 8,940,568 B2 | 1/2015 | Mohan et al. | | |
| 9,142,779 B2 | 9/2015 | Chan et al. | | |
| 9,657,392 B2 | 5/2017 | Han | | |
| 10,644,239 B2 | 5/2020 | Gosh et al. | | |
| 2002/0180331 A1 | 12/2002 | Fukumoto | | |
| 2004/0086639 A1 | 5/2004 | Grantham et al. | | |
| 2004/0115338 A1 | 6/2004 | Yoneda | | |
| 2004/0142108 A1 | 7/2004 | Atobe et al. | | |
| 2004/0197675 A1 * | 10/2004 | Shibata | | G03F 1/20 430/5 |
| 2004/0219465 A1 | 11/2004 | Meijer et al. | | |
| 2005/0212419 A1 | 9/2005 | Vazan et al. | | |
| 2007/0024831 A1 * | 2/2007 | Hibbs | | G03F 7/707 355/53 |
| 2007/0092650 A1 | 4/2007 | Albrecht et al. | | |
| 2007/0099395 A1 | 5/2007 | Sridhar et al. | | |
| 2007/0246705 A1 | 10/2007 | Li et al. | | |
| 2009/0091238 A1 | 4/2009 | Cok et al. | | |
| 2010/0297349 A1 | 11/2010 | Lee et al. | | |
| 2012/0178190 A1 * | 7/2012 | Krijne | | C23C 14/042 438/22 |
| 2013/0168231 A1 | 7/2013 | Yang et al. | | |
| 2013/0252364 A1 | 9/2013 | Kawato et al. | | |
| 2013/0320837 A1 | 12/2013 | Weaver et al. | | |
| 2013/0344612 A1 | 12/2013 | Zuo | | |
| 2015/0041793 A1 * | 2/2015 | Chan | | H01L 51/0018 257/40 |
| 2015/0275351 A1 | 10/2015 | Lee et al. | | |
| 2015/0299840 A1 | 10/2015 | Osaki et al. | | |
| 2015/0338751 A1 * | 11/2015 | Ogura | | G03F 7/70725 355/72 |
| 2015/0380652 A1 | 12/2015 | Chan et al. | | |
| 2016/0141498 A1 | 5/2016 | Ghosh et al. | | |
| 2016/0194747 A1 * | 7/2016 | Kawato | | C23C 14/24 438/46 |
| 2016/0201195 A1 * | 7/2016 | Lee | | B05B 1/14 239/132 |
| 2016/0301006 A1 * | 10/2016 | Obata | | C23C 14/042 |
| 2017/0081758 A1 * | 3/2017 | Inoue | | H01L 51/56 |
| 2017/0092862 A1 * | 3/2017 | Obata | | C23C 14/042 |
| 2017/0104158 A1 | 4/2017 | Kawato et al. | | |
| 2017/0218499 A1 * | 8/2017 | Liu | | C23C 14/24 |
| 2017/0283938 A1 | 10/2017 | Yao et al. | | |
| 2017/0342542 A1 | 11/2017 | Ghosh et al. | | |
| 2017/0342543 A1 | 11/2017 | Ghosh et al. | | |
| 2017/0343901 A1 | 11/2017 | Ghosh et al. | | |

FOREIGN PATENT DOCUMENTS

| | | | | |
|---|---|---|---|---|
| CN | 102482759 A | 5/2012 | | |
| CN | 103238374 A | 8/2013 | | |
| CN | 203159695 U | 8/2013 | | |
| CN | 103282543 A | 9/2013 | | |
| CN | 103582466 | 2/2014 | | |
| CN | 104911548 A | 9/2015 | | |
| CN | 105378139 A | 3/2016 | | |
| EP | 1426462 A2 | 6/2004 | | |
| EP | 2168644 A1 | 3/2010 | | |
| EP | 2947512 A2 | 11/2015 | | |
| JP | 03-104865 A | 5/1991 | | |
| JP | 06-330309 A | 11/1994 | | |
| JP | H0729814 A | 1/1995 | | |
| JP | 07-041943 | 2/1995 | | |
| JP | 07-150347 A | 6/1995 | | |
| JP | 07-316808 A | 12/1995 | | |
| JP | 10-050584 A | 2/1998 | | |
| JP | 2004-119064 A | 4/2004 | | |
| JP | 2004-183044 A | 7/2004 | | |
| JP | 2005-339858 A | 12/2005 | | |
| JP | 2005339858 | * 12/2005 | | C23C 14/24 |
| JP | 2010-270396 A | 12/2010 | | |
| JP | 2012-052155 A | 3/2012 | | |
| JP | 2012-522891 A | 9/2012 | | |
| JP | 2014-201832 A | 10/2014 | | |
| JP | 2014201832 | * 10/2014 | | C23C 14/24 |
| JP | 2016092316 A | 5/2016 | | |
| KR | 10-2014-0074614 A | 6/2014 | | |
| RU | 2032765 C1 | 4/1995 | | |
| RU | 2155204 C2 | 8/2000 | | |
| RU | 2538891 C2 | 1/2015 | | |
| RU | 2014138799 A | 4/2016 | | |
| RU | 2588921 C2 | 7/2016 | | |
| TW | 201100577 A | 1/2011 | | |
| TW | 201614091 | 4/2016 | | |
| WO | 2000008228 A1 | 2/2000 | | |
| WO | 2002024321 A1 | 3/2002 | | |
| WO | 2010113102 A1 | 10/2010 | | |
| WO | 2012/086456 A1 | 6/2012 | | |
| WO | 2014/002841 A1 | 1/2014 | | |
| WO | 2014/119452 A1 | 8/2014 | | |
| WO | 2015/186796 A1 | 12/2015 | | |

OTHER PUBLICATIONS

Luis Guillermo Villaneuva et al., "Resistless Fabrication of Nanoimprint Lithography (NIL) Stamps Using Nano-Stencil Lithography"; http://www.mdpi.com/2072-666X/4/4/370/htm, "Micromachines", Oct. 15, 2013, vol. 4(4), 370-377, Publisher: MDPI; doi :10.3390/mi4040370, Published in: CH.

"Office Action" issued in related co-pending U.S. Appl. No. 14/941,825, dated Apr. 20, 2017.

Fu-Ching Tung et al., "OLED Fabrication by Using a Novel Planar Evaporation Technique", http://dx/doi.org/10.1155/2014/683037, "International Journal of Photoenergy", Publisher: Hindawi Publishing Corporation, dated Jun. 22, 2014, vol. 2014, Article ID 683037, 8 pages, Published in: TW.

"Taiwan Office Action", Taiwan Patent Application 106117271, dated Jan. 18, 2018, 18 pp.

"Non-Final Office Action" received for U.S. Appl. No. 14/941,825, dated Jun. 1, 2018, 13 pages.

(56) References Cited

OTHER PUBLICATIONS

"Notice of Allowance" received for U.S. Appl. No. 15/597,635, dated Jun. 6, 2018, 9 pages.
"Office Action" issued in related Taiwan Application No. 106117271, dated Jan. 17, 2018, pp. 18.
"Final Office Action", U.S. Appl. No. 14/941,825, dated Nov. 14, 2017, 11 pp.
"Non Final Office", U.S. Appl. No. 15/597,635, dated Nov. 17, 2017, 15 pp.
Officer E. Eskina, "International Search Report and the Written Opinion", International Patent Application PCT/US2017/033161, dated Aug. 11, 2017, 9 pp.
Officer A. Pimenova, "International Search Report and the Written Opinion", International Patent Application PCT/US2017/034203, dated Aug. 15, 2017, 8 pp.
Officer A. Pimenova, "International Search Report and the Written Opinion", International Patent Application PCT/IB2017/054481, dated Oct. 25, 2017, 11 pp.
Advisory Action (PTOL-303) received for U.S. Appl. No. 14/941,825, dated Apr. 17, 2019, 3 pages.
Examiner initiated interview summary (PTOL-413B) received for U.S. Appl. No. 14/941,825, dated Apr. 17, 2019, 2 pages.
Office Action issued in related Chinese patent application No. 201780040228.5, dated Jul. 17, 2019, 7 pp.
Non-Final Rejection received for U.S. Appl. No. 14/941,825, dated May 16, 2019, 12 pages.
Notice of Allowance received for U.S. Appl. No. 15/602,939, dated Jun. 24, 2019, 9 pages.
Non-Final Rejection received for U.S. Appl. No. 15/602,939, dated Feb. 25, 2019, 13 pages.
Final Rejection received for U.S. Appl. No. 14/941,825, dated Dec. 31, 2018, 12 pages.
Advisory Action received for U.S. Appl. No. 14/941,825, dated Dec. 9, 2019, 3 pages.
Advisory Action received for U.S. Appl. No. 14/941,825, dated Jan. 14, 2020, 3 pages.
Extended European Search Report issued in EP Patent Application No. 17802312.3 dated Jan. 8, 2020.
Extended European Search Report issued in EP Patent Application No. 17803492.2 dated Jan. 8, 2020.
Final Office Action received for U.S. Appl. No. 14/941,825, dated Nov. 25, 2019, 10 pages.
Notice of Allowance received for U.S. Appl. No. 14/941,825, dated Feb. 6, 2020, 8 pages.
Office Action dated Jan. 13, 2020 in related Chinese Patent Application No. 201780040228.5.
Chinese Office Action and English Translation of Office Action dated May 18, 2020 in Chinese Patent Application No. 201780040228.5.
Office Action issued in corresponding Chinese patent application No. 201780040228.5, dated Sep. 8, 2020, 16 pp.
English Translation of Search Report issued in Taiwan Patent Application No. 106128730 dated Feb. 2, 2021.
Office Action issued in related Japanese patent application No. 2018-561623, dated May 31, 2021, 7 pp. w/ translation.
Office Action issued in related Japanese patent application No. 2018-561621, dated May 24, 2021, 16 pp. w/ translation.
Office Action issued in related Korean patent application No. 10-2018-7037178, dated Jun. 7, 2021, 9 pp. w/ translation.
Office Action issued in related Korean patent application No. 10-2018-7037179, dated Jun. 8, 2021, 12 pp. w/ translation.
Office Action issued in counterpart Japanese patent application No. 2018-561973, dated Sep. 6, 2021, 7 pp. w/ translation.
Office Action issued in counterpart Korean patent application No. 10-2018-7037120, dated Aug. 18, 2021, 7 pp. w/ translation.
Decision of Rejection issued in Japanese patent application No. 2018-561621, dated Sep. 21, 2021, 6 pp. w/ translation.
"Non-Final Office Action", U.S. Appl. No. 15/602,939, dated Feb. 23, 2018, 11 pp.
Office Action issued in Japanese patent application No. 2018-561623, dated Dec. 20, 2021, 6 pp. w/ translation.

* cited by examiner

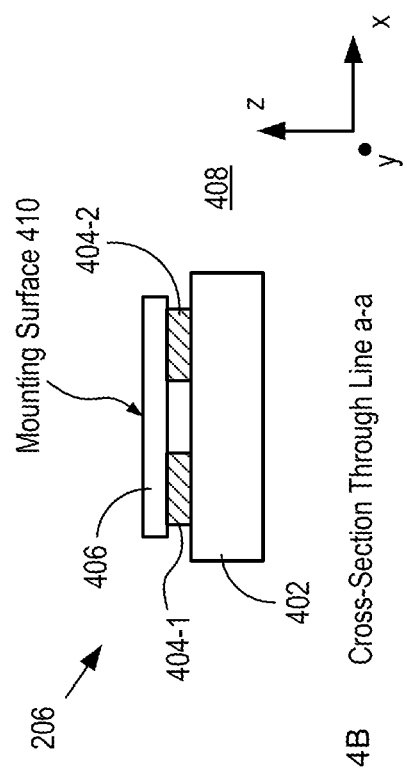
FIG. 4B  Cross-Section Through Line a-a
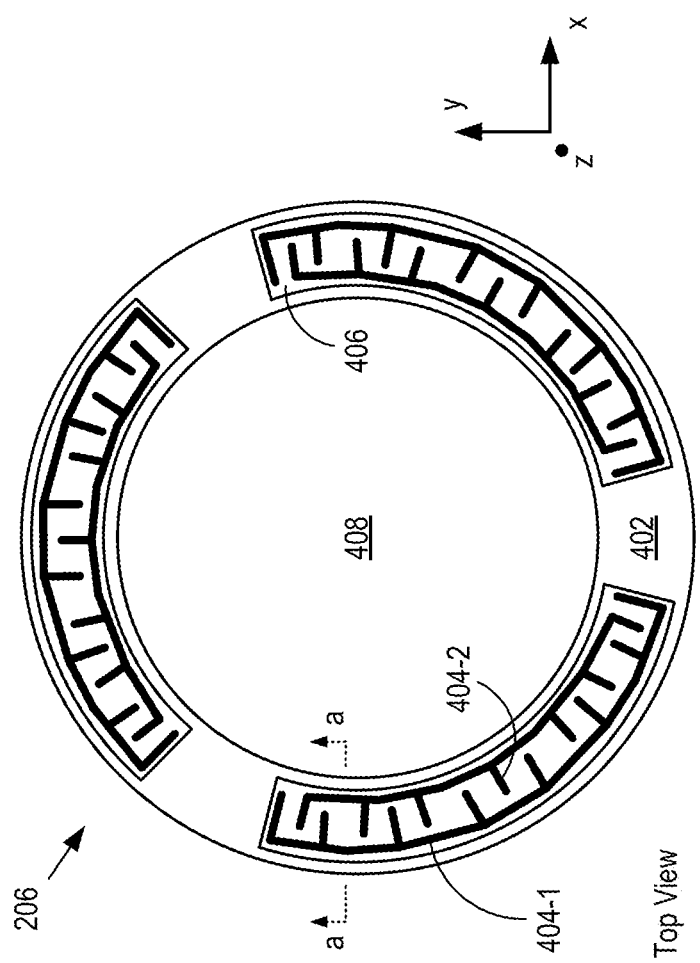
Top View
FIG. 4A

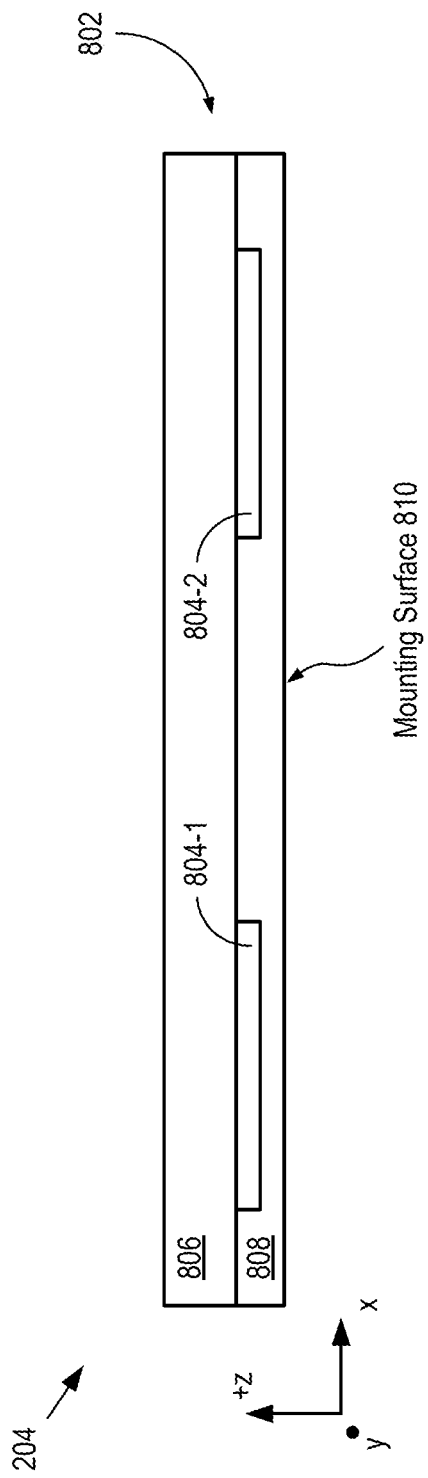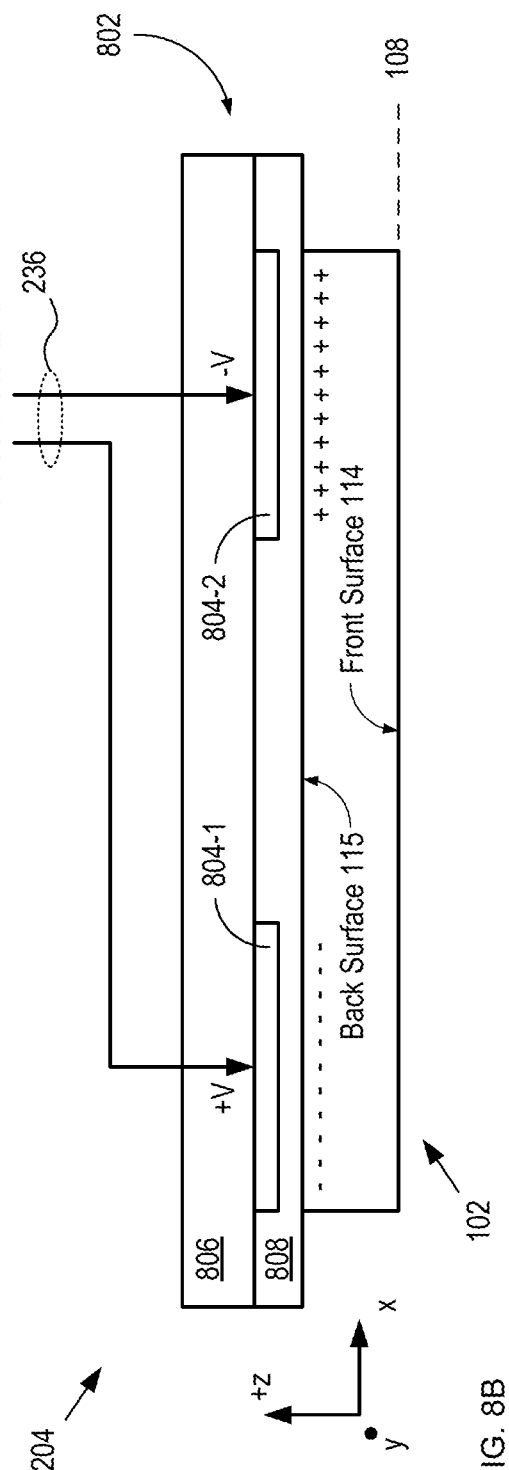

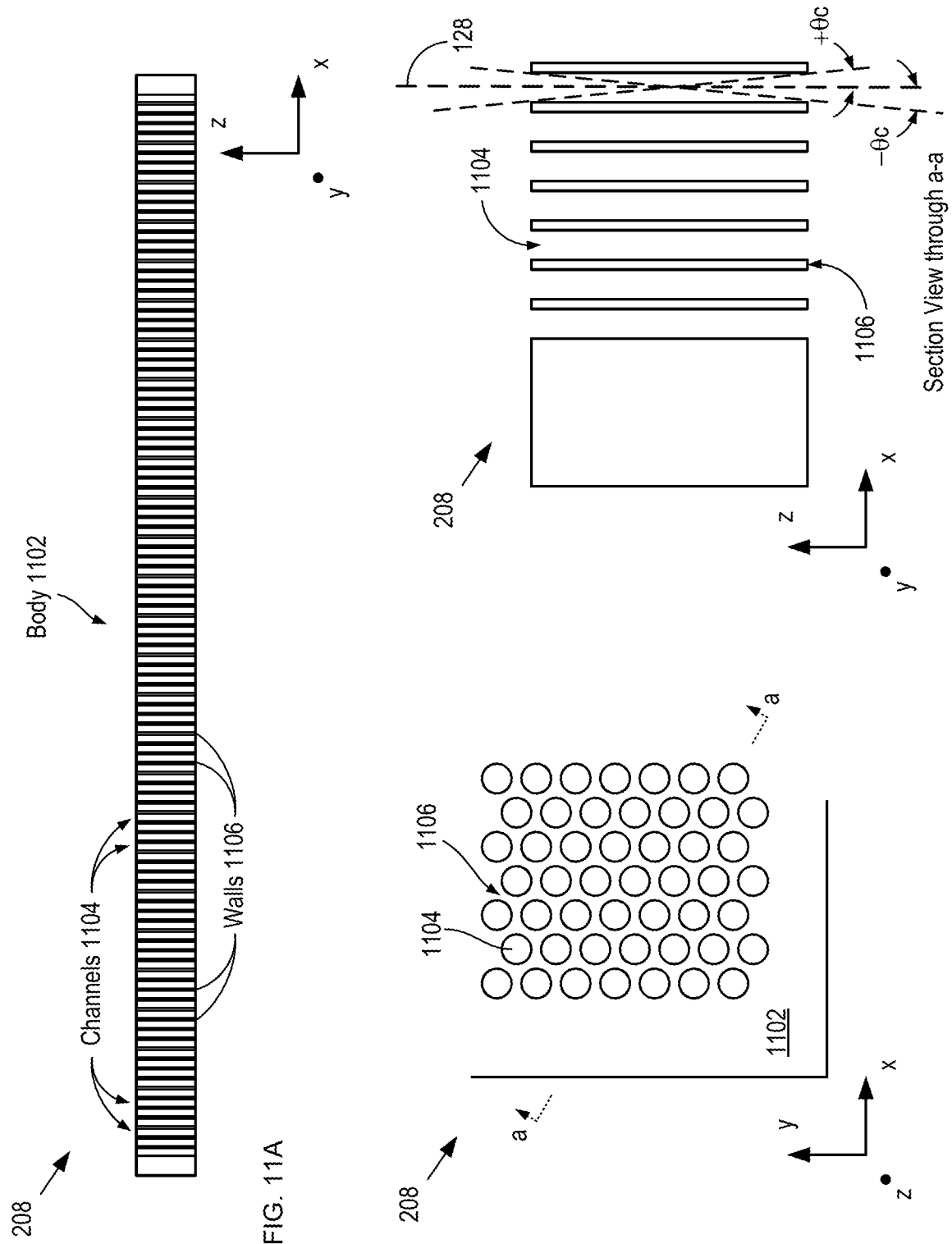

HIGH-PRECISION SHADOW-MASK-DEPOSITION SYSTEM AND METHOD THEREFOR

STATEMENT OF RELATED CASES

This case is a Continuation-in-Part of co-pending U.S. Non-Provisional patent application Ser. No. 15/597,635 filed on May 17, 2017, which claims priority to U.S. Provisional Patent Application Ser. No. 62/340,793 filed on May 24, 2016, each of which is incorporated herein by reference in its entirety. It also claims priority to U.S. Non-Provisional patent application Ser. No. 15/602,939 filed on May 23, 2017, which is incorporated herein by reference in its entirety.

FIELD OF THE INVENTION

The present invention relates to thin-film deposition in general, and, more particularly, evaporation-based thin-film deposition.

BACKGROUND OF THE INVENTION

Shadow-mask-based deposition is a process by which a layer of material is deposited onto the surface of a substrate such that the desired pattern of the layer is defined during the deposition process itself. This is deposition technique is sometimes referred to as "direct patterning."

In a typical shadow-mask deposition process, the desired material is vaporized at a source that is located at a distance from the substrate, with a shadow mask positioned between them. As the vaporized atoms of the material travel toward the substrate, they pass through a set of through-holes in the shadow mask, which is positioned just in front of the substrate surface. The through-holes (i.e., apertures) are arranged in the desired pattern for the material on the substrate. As a result, the shadow mask blocks passage of all vaporized atoms except those that pass through the through-holes, which deposit on the substrate surface in the desired pattern. Shadow-mask-based deposition is analogous to silk-screening techniques used to form patterns (e.g., uniform numbers, etc.) on articles of clothing or stenciling used to develop artwork.

Shadow-mask-based deposition has been used for many years in the integrated-circuit (IC) industry to deposit patterns of material on substrates, due, in part, to the fact that it avoids the need for patterning a material layer after it has been deposited. As a result, its use eliminates the need to expose the deposited material to harsh chemicals (e.g., acid-based etchants, caustic photolithography development chemicals, etc.) to pattern it. In addition, shadow-mask-based deposition requires less handling and processing of the substrate, thereby reducing the risk of substrate breakage and increasing fabrication yield. Furthermore, many materials, such as organic materials, cannot be subjected to photolithographic chemicals without damaging them, which makes depositing such materials by shadow mask a necessity.

Unfortunately, the feature resolution that can be obtained by conventional shadow-mask deposition is diminished due to the fact that the deposited material tends to spread laterally after passing through the shadow mask—referred to as "feathering." Feathering increases with the magnitude of the separation between the substrate and the shadow mask. To mitigate feathering, this separation is kept as small as possible without compromising the integrity of the chucks that hold the substrate and shadow mask. Still further, any non-uniformity in this separation across the deposition area will give rise to variations on the amount of feathering. Such non-uniformity can arise from, for example, a lack of parallelism between the substrate and shadow mask, bowing or sagging of one or both of the substrate and shadow mask, and the like.

Unfortunately, it can be difficult to position the shadow mask and substrate close enough to avoid giving rise to significant amounts of feathering. Furthermore, a shadow mask must be supported only at its perimeter to avoid blocking the passage of the vaporized atoms to the through-hole pattern. As a result, the center of the shadow mask can sag due to gravity, which further exacerbates feathering issues.

In practice, therefore, critical features formed by prior-art shadow-mask-based deposition techniques are typically separated by relatively large areas of open space to accommodate feathering, which limits the device density that can be obtained. For example, each pixel of an active-matrix organic light-emitting-diode (AMOLED) display normally includes several regions of organic light-emitting material, each of which emits a different color of light. Due to feathering issues, prior-art AMOLED displays have typically been restricted to approximately 600 pixels-per-inch (ppi) or less, which is insufficient for many applications, such as near-to-eye augmented reality and virtual-reality applications. In addition, the need for large gaps within and between the pixels gives rise to a reduced pixel fill factor, which reduces display brightness. As a result, the current density through the organic layers must be increased to provide the desired brightness, which can negatively impact display lifetime.

An alternative approach is to use a shadow-mask with an aperture as large as the active area of the display itself to deposit a monochrome white-emitting organic layer across the entire display and then to pattern or deposit red, green and blue color filters on top of the OLED. These color filters absorb all of the emitted white light except for the red, green or blue portion of the spectrum (depending on the color filter), allowing a full color image to be created. However, these color filters absorb up to 80% of the emitted light which significantly reduces display brightness, again requiring operation at higher than desirable drive currents.

The need for a process that enables high-resolution direct patterning remains unmet in the prior art.

SUMMARY OF THE INVENTION

The present invention enables high-resolution direct deposition of a patterned layer of material on a substrate without some of the costs and disadvantages of the prior art. Embodiments of the present invention filter the propagation angles of vaporized atoms to a narrow range around a direction normal to the surface of the substrate. As a result, feathering of deposited material outside the lateral dimensions of features of a shadow mask is mitigated. Embodiments of the present invention are particularly well suited for use in deposition of sensitive materials, such as organic light-emitting material. Embodiments are also well suited for deposition of other thin- and thick-film layers in packaging applications, integrated-circuit processing applications, and the like.

The present invention further enables high-precision alignment of a shadow mask and substrate that can be in contact or separated by only a few microns. The present invention also provides for mitigation of gravity-induced sag of a shadow mask that is supported only at its perimeter. Embodiments of the present invention are particularly well suited for applications requiring high-density patterns of material on a substrate, such as dense-pixel displays (DPD), high-definition displays, and the like.

An illustrative embodiment of the present invention is a direct-patterning deposition system in which a material is vaporized at a source such that it deposits on a surface of a substrate after passing through an aperture pattern of a shadow mask. Prior to their arrival at the shadow mask, the vaporized atoms pass through a collimator that blocks all vaporized atoms except those having propagation angles close to the direction normal to the substrate surface. As a result, the lateral deviation between the apertures and their respective regions of deposited material is reduced as compared to the prior art.

The collimator includes a plurality of channels having a high height-to-width aspect ratio, where the longitudinal axis of the channels is substantially aligned with the normal direction. As a result, those vaporized atoms travelling along directions other than close to normal are blocked by the inside walls of the channels.

In some embodiments, the source is dimensioned and arranged to provide a conically shaped vapor plume of vaporized atoms such that the entire substrate surface receives vaporized material at the same time. In some of these embodiments, the source is moved along a path such that the uniformity of the thickness of deposited material is improved over the two-dimensional area of the substrate surface.

In some embodiments, the source is a linear source that emits a fan-shaped vapor plume, where the linear source is moved along a direction that is unaligned with its longitudinal axis. In some of these embodiments, the source is moved along a direction that is substantially orthogonal to both the longitudinal axis of the source and the normal direction. In some of these embodiments, the source is moved along a non-linear path.

In some embodiments, the source includes a plurality of individual nozzles, each of which emits a conically shaped vapor plume such that the nozzles collectively provide a flow of vaporized atoms that is substantially uniform over the area of the substrate surface.

In some embodiments, the source is a two-dimensional planar source that is arranged parallel to and facing the substrate such that, when heated, organic material vaporizes uniformly across the planar surface of the source. In some embodiments, relative motion between the source and shadow mask is provided to improve the thickness uniformity of the deposited material over the two-dimensional area of the substrate surface.

Another illustrative embodiment of the present invention is a direct-patterning deposition system comprising a first chuck having a first mounting surface for holding a substrate and a second chuck having a second mounting surface for holding a shadow mask that comprises a pattern of through-holes. The second chuck includes a frame that surrounds a central opening that exposes the pattern of though-holes in the shadow mask. As a result, during deposition, vaporized atoms of the material can pass through the second chuck and the through-holes to deposit in a desired pattern on a deposition region of the front surface of the substrate.

The first chuck generates a first electrostatic force that is selectively applied to the back surface of the substrate. The first chuck is also dimensioned and arranged such that it does not project above the front surface of the substrate. In similar fashion, the second chuck generates a second electrostatic force that is selectively applied to the back surface of the shadow mask. The second chuck is also dimensioned and arranged so that it does not project above the front surface of the shadow mask. When the shadow mask and substrate are in alignment for a deposition, no part of either the first and second chuck encroaches into the three-dimensional space between the substrate and the shadow mask. As a result, the substrate and shadow mask can be positioned brought very close, or even in contact, during deposition, thereby mitigating feathering.

In some embodiments, at least one of the first and second attractive forces is a force other than electrostatic, such as a vacuum-generated force, a magnetic force, etc.

In some embodiments, the second mounting surface is dimensioned and arranged to create a tensile stress in the front surface of the shadow mask that mitigates gravity-induced sag of its central region. In some such embodiments, the frame of the second chuck is shaped such that its mounting surface slopes away from top edge of the inner perimeter of the frame. As a result, when the shadow mask is mounted in the second chuck, the shadow mask becomes slightly bowed, which induces a tensile stress in the front surface of the shadow mask. In some of these embodiments, the mounting surface is curved downward from the top edge of the inner perimeter of the frame.

An embodiment of the present invention is a system for depositing a first material on a plurality of deposition sites in a deposition region of a substrate, the plurality of deposition sites being arranged in a first arrangement, wherein the substrate includes a first major surface and a second major surface that comprises the deposition region, the system comprising: a source for providing a first plurality of vaporized atoms of the first material, each vaporized atom of the first plurality thereof propagating along a propagation direction that is characterized by a propagation angle relative to a first direction that is normal to a first plane defined by the substrate, wherein the range of propagation angles of the first plurality of vaporized atoms spans a first angular range; a shadow mask comprising a plurality of through-holes arranged in the first arrangement, wherein the shadow mask includes a third major surface and a fourth major surface that comprises the through-holes; a first chuck for holding the substrate, the first chuck being dimensioned and arranged to selectively impart a first attractive force on the first major surface; a second chuck for holding the shadow mask, the second chuck comprising a frame that surrounds a first opening that enables the material to pass through the second chuck to the through-holes, the second chuck being dimensioned and arranged to selectively impart a second attractive force on the third major surface; a collimator comprising a plurality of channels, the collimator being between the source and the shadow mask, wherein each channel of the plurality thereof is dimensioned and arranged to pass only vaporized atoms having a propagation angle within a second angular range that is smaller than the first angular range; and a positioning system for controlling the relative position of the first chuck and the second chuck to align the shadow mask and the substrate.

Another embodiment of the present invention is a system for depositing a first material on a plurality of deposition sites in a deposition region of a substrate, the plurality of deposition sites being arranged in a first arrangement, wherein the substrate includes a first major surface and a second major surface having a first lateral extent, the system comprising: a source that is operative for providing a plurality of vaporized atoms, each vaporized atom of the plurality thereof traveling along a propagation direction that defines a propagation angle, wherein the plurality of propagation angles span a first angular range; a shadow mask comprising a plurality of through-holes arranged in the first arrangement, wherein the shadow mask includes a third major surface and a fourth major surface that comprises the through-holes, wherein the shadow mask and the plurality of deposition sites collectively define an acceptable angular range that is less than the first angular range; a first chuck for holding the substrate; a second chuck for holding the shadow mask, the second chuck comprising a frame that surrounds a first opening that enables the material to pass through the second chuck to the through-holes; wherein, when the shadow mask and substrate are aligned, the shadow mask and substrate collectively define a second region, the second region (1) having a second lateral extent that is equal to or larger than the first lateral extent, (2) having a thickness that is equal to a separation between the substrate and the shadow mask, and (3) excluding the first chuck and the second chuck; wherein the first chuck and second chuck are dimensioned and arranged to enable the thickness to be less than 10 microns; and a collimator that is located between the source and the shadow mask, the collimator comprising a plurality of channels, each channel of the plurality thereof having a height-to-width aspect ratio that defines a filtered angular range that is less than or equal to the acceptable angular range.

Yet another embodiment of the present invention is a method for depositing a first material on a plurality of deposition sites arranged in a first arrangement on a substrate, wherein the substrate includes a first major surface and a second major surface having a first lateral extent, the second major surface comprising the first region, wherein the method comprises: receiving a first plurality of vaporized atoms at a collimator that is located between a source and a shadow mask having a plurality of through-holes arranged in the first arrangement, wherein the shadow mask includes a third major surface and a fourth major surface that comprises the through-holes, wherein the first plurality of vaporized atoms is characterized by a first range of propagation angles; holding the substrate in a first chuck that imparts a first attractive force selectively on the first major surface; holding the shadow mask in a second chuck that imparts a second attractive force selectively on the third major surface, wherein the second chuck enables the passage of particles comprising the material through the second chuck to the through-holes; selectively passing a second plurality of vaporized atoms through the collimator to the shadow mask, wherein the second plurality of vaporized atoms is characterized by a second range of propagation angles that is narrower than the first range of propagation angles; and positioning the substrate and the shadow mask such that the second major surface and the fourth major surface are separated by a distance that is less than or equal to 10 microns; and enabling at least some of the second plurality of vaporized atoms to pass through the second chuck and plurality of through-holes to deposit on the substrate.

BRIEF DESCRIPTION OF THE DRAWINGS

FIGS. 4A-B depicts a schematic drawings of top and cross-section views, respectively, of a mask chuck in accordance with the illustrative embodiment.

FIG. 8A depicts a schematic drawing of a cross-sectional view of a mask chuck in accordance with the illustrative embodiment.

FIG. 8B depicts a schematic drawing of a cross-sectional view of substrate chuck 204 while holding substrate 102.

FIG. 11A depicts a schematic drawing of a cross-sectional view of a collimator in accordance with the illustrative embodiment.

FIGS. 11B-C depict schematic drawings of top and sectional views, respectively, of a region of collimator 208.

DETAILED DESCRIPTION

Figure 1:
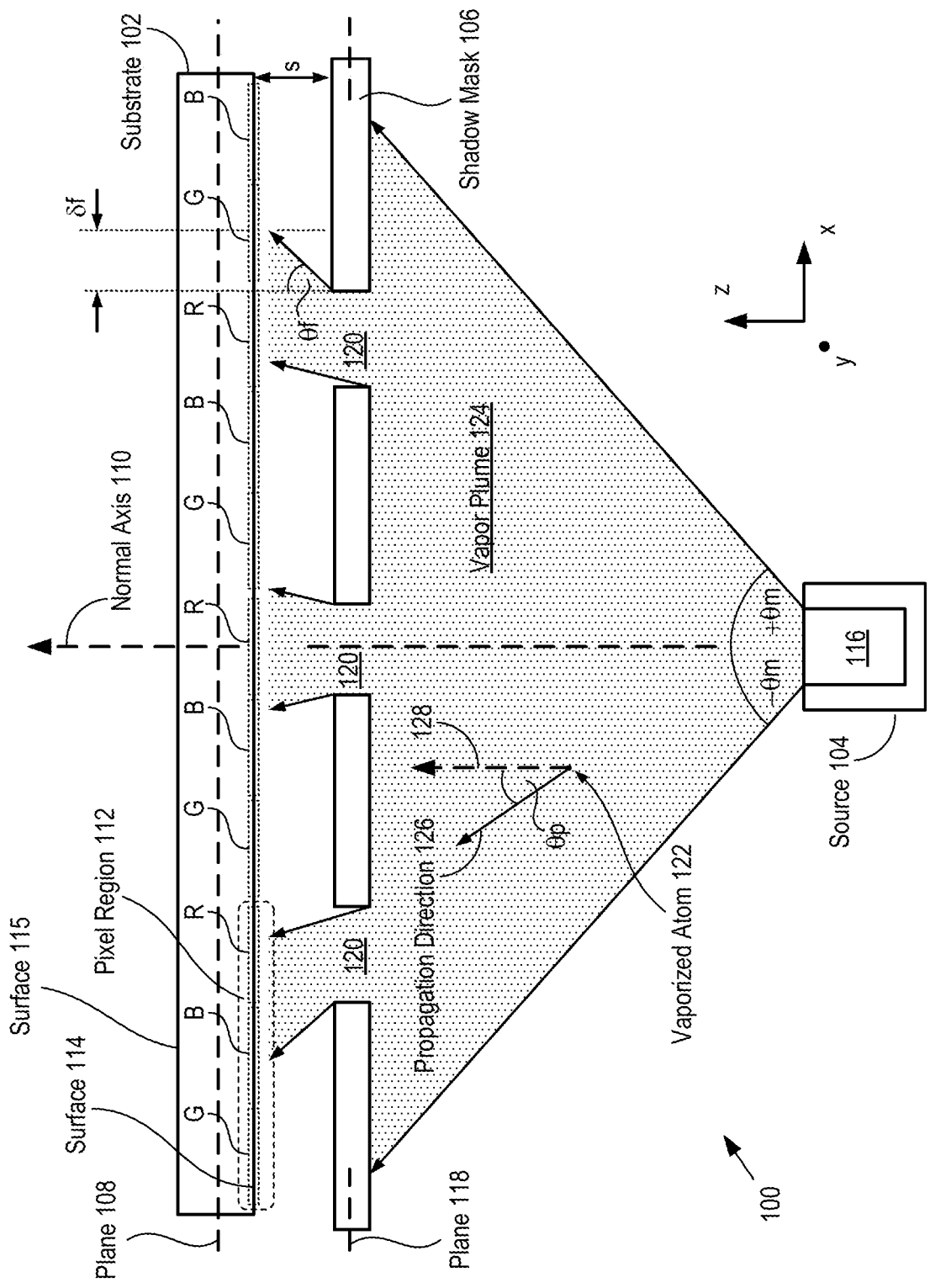
FIG. 1 depicts a schematic drawing of a cross-section of the salient features of a direct-patterning deposition system in accordance with the prior art.

FIG. 1 depicts a schematic drawing of a cross-section of the salient features of a direct-patterning deposition system in accordance with the prior art. System 100 is a conventional evaporation system that deposits a desired pattern of material on a substrate by evaporating the material through a shadow mask positioned in front of the substrate. System 100 includes source 104 and shadow mask 106, which are arranged within a low-pressure vacuum chamber (not shown).

Substrate 102 is a glass substrate suitable for the formation of active-matrix organic-light-emitting-diode (AMOLED) displays. Substrate 102 includes surface 114, which defines plane 108 and normal axis 110. Normal axis 110 is orthogonal to plane 108. Surface 114 includes a plurality of deposition sites, G, for receiving material that emits green light, a plurality of deposition sites, B, for receiving material that emits blue light, and a plurality of deposition sites, R, for receiving material that emits red light. The deposition sites are arranged in a plurality of pixel regions 112 such that each pixel region includes one deposition site for the light-emitting material of each color.

Source 104 is a crucible for vaporizing material 116, which is an organic material that emits light at a desired wavelength. In the depicted example, material 116 is an organic light-emitting material that emits red light. In the depicted example, source 104 is a single-chamber crucible that is centered with respect to substrate 102; however, in some embodiments, source 104 includes a plurality of chambers that are arranged in one- and/or two-dimensional arrangements. When material 116 is melted or sublimed within the low-pressure atmosphere of the vacuum chamber 110, vaporized atoms 122 of material 116 are ejected from the source and propagate toward substrate 102 in substantially ballistic fashion. The vaporized atoms ejected by source 104 collectively define vapor plume 124.

Shadow mask 106 is a plate of structural material that includes apertures 120. Shadow mask is substantially flat and defines plane 118. The shadow mask is located between source 104 and substrate 102 such that it blocks the passage of all of the vaporized atoms except those that pass through its apertures. The shadow mask and substrate are separated by separation, s, (typically a few tens or hundreds of microns), planes 108 and 118 are substantially parallel, and apertures 120 are aligned with deposition sites R.

Ideally, when depositing red-emitting material 116, vaporized atoms are incident only on deposition sites R. Unfortunately, vapor plume 124 includes vaporized atoms that travel along many different propagation directions 126, many of which are not aligned with the direction of normal axis 110. As a result, a large fraction of the vaporized atoms that pass through apertures 120 are travelling along propagation directions that have a significant lateral component. The point at which each vaporized atom is incident on surface 114 is geometrically determined by its propagation angle and the spatial relationship between the substrate and shadow mask—specifically, spacing s and the alignment of apertures 120 with deposition sites R. For the purposes of this Specification, including the appended claims, the term "propagation angle" is defined as the angle formed by the propagation direction of a vaporized atom with respect to the direction normal to plane 108 of substrate 102 (i.e., normal direction 128, which is aligned with normal axis 110). For example, vaporized atom 122 travels along a propagation direction 126, which forms propagation angle, $\theta p$, with respect to normal direction 128.

The propagation angles of the vaporized atoms of vapor plume 124 span a relatively large angular range of $-\theta m$ to $+\theta m$, which gives rise to significant disadvantages for prior-art direct-deposition systems. In particular, it results in the deposition of material 118 on front surface 114 outside the perimeter of apertures 120, which is typically referred to as "feathering." Furthermore, the amount of feathering at an aperture increases with the distance of that aperture from the center of substrate 102.

For apertures located near the center of vapor plume 124, vaporized atoms 122 arriving at shadow mask 106 have propagation angles that are within a relatively small angular range. In other words, they are travelling along directions that are only slightly misaligned with normal axis 110. As a result, vaporized atoms that pass through these apertures exhibit only minimal lateral drift (i.e., feathering) after passing through the shadow mask. In this region, therefore, the lateral extent of the deposited material 116 is typically nearly aligned with the edges of apertures 120 (i.e., it deposits primarily on the targeted deposition sites R).

For apertures further away from the center of vapor plume 124, however, vaporized atoms arriving at shadow mask 106 span a relatively larger angular range and include propagation angles closer to $|\theta m|$. As a result, in these regions, the lateral distance traveled by vaporized atoms after passing through the shadow mask is greater, leading to deposited material feathering out well beyond the lateral extent of the aperture. This results in a lateral offset, $\delta f$, between the edges of the aperture openings and the perimeters of the areas in which material 116 deposits. The deposited material, therefore, extends beyond the area of the targeted deposition sites. In some cases, such feathering can lead to deposition of material on adjacent deposition sites that are intended for different light-emitting material (i.e., deposition sites, B and/or G), thereby leading to color mixing.

It should be noted that feathering is exacerbated by any additional misalignments between the shadow mask and substrate, such as deviations from the parallelism of planes 108 and 118 (i.e., relative pitch and/or yaw between the mask and substrate), non-flatness of the shadow mask and/or substrate, and translational and/or rotational misalignment between the shadow mask and substrate. Still further, in many prior-art deposition systems (e.g., systems for depositing more than one material, etc.), source 104 is located off-center from the substrate, which leads to even greater feathering problems.

One skilled in the art will recognize that placing shadow mask 106 in contact with substrate 102 during deposition would mitigate, or even completely eliminate, feathering issues. Unfortunately, this is either undesirable or not possible in many cases for several reasons. First, prior-art substrate and shadow mask chucks typically include features that project above the substrate and shadow mask, respectively. As a result, these features act as blocking elements that limit how closely the substrate and shadow mask can be positioned. Second, contact with the shadow mask can cause damage to existent structures on the surface of the substrate. Third, damage to the shadow mask can result from contact with the substrate. Fourth, residue can be left on the shadow mask surface upon removal from contact with the substrate. Frequent cleaning of the shadow mask then becomes necessary, which increases process time and overall cost, while also creating the potential for mask damage during the cleaning operations. As a result, prior-art shadow mask deposition has been substantially limited to non-contact configurations in which feathering has significant negative impact. Fifth, conventional shadow masks are normally made of metal and are, therefore, necessarily quite thick. When placed in contact with the substrate, a thick shadow mask gives rise to shadowing within each aperture region that results in the edges of the deposited features being thinner. For thicker shadow masks, such as those typically used in the prior art, more material is lost due to the walls of the apertures and the edges of the sub-pixel become thinner.

The present invention enables direct deposition without some of the disadvantages of the prior art, however. It is a first aspect of the present invention that feathering can be significantly reduced by allowing only vaporized atoms that propagate along directions nearly normal to the surface of the substrate to reach the shadow mask, thereby enabling patterns of deposited material having higher resolution and fidelity to the aperture pattern of the shadow mask.

It is another aspect of the present invention that the use of a non-metal material, such as silicon nitride, for a shadow mask enables it to be extremely thin ($\leq 1$ micron), thereby giving rise to significantly less shadowing that prior-art shadow masks.

It is yet another aspect of the present invention that gravity-induced sag of a shadow mask can be reduced or eliminated by using a shadow-mask chuck that is dimensioned and arranged to counter the effects of gravity on the shadow mask.

It is another aspect of the present invention that substrate and shadow-mask chucks having no structure that projects above the top surface of the substrate and shadow mask enables extremely small separation, or even contact, between the substrate and shadow mask, thereby mitigating feathering. Substrate/shadow mask contact can also increase their stability during deposition, improve material utilization by reducing waste, enable faster deposition and higher throughput, and enable deposition at lower temperatures.

Figure 2:
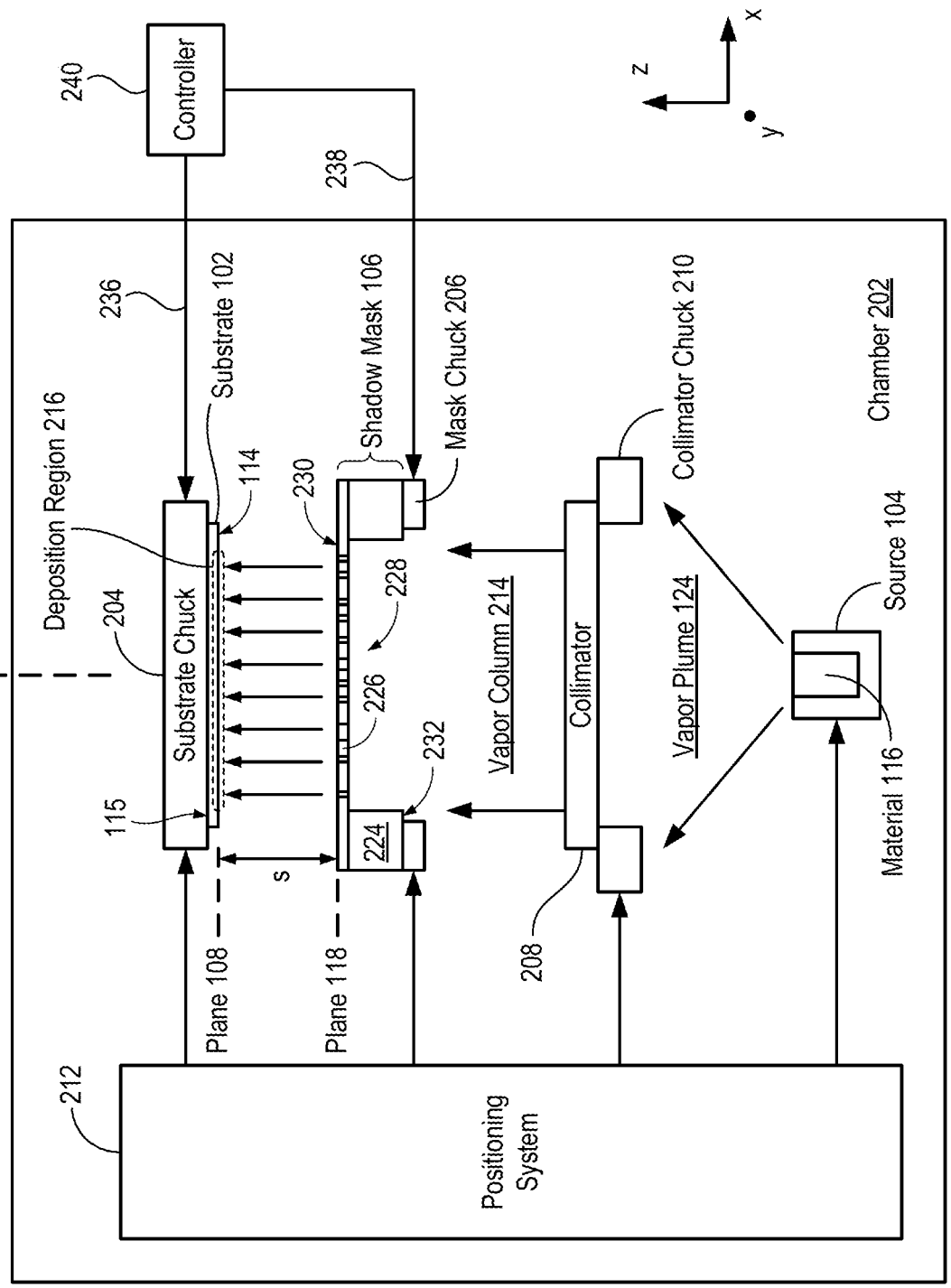
FIG. 2 depicts a schematic drawing of a cross-section of the salient features of a high-precision, direct-patterning deposition system in accordance with an illustrative embodiment of the present invention.

FIG. 2 depicts a schematic drawing of a cross-section of the salient features of a high-precision, direct-patterning deposition system in accordance with an illustrative embodiment of the present invention. System 200 includes vacuum chamber 202, substrate chuck 204, source 104, shadow mask 106, mask chuck 206, collimator 208, and positioning system 212. System 200 is operative for evaporating a desired pattern of material onto a substrate surface without the need for subsequent subtractive patterning operations, such as photolithography and etching.

System 200 is described herein with respect to the deposition of a pattern of light-emitting material on a glass substrate as part of the fabrication of an AMOLED display. However, it will be clear to one skilled in the art, after reading this Specification, that the present invention can be directed toward the formation of directly patterned layers of virtually any thin- and thick-film material (organic or inorganic) on any of a wide range of substrates, such as semiconductor substrates (e.g., silicon, silicon carbide, germanium, etc.), ceramic substrates, metal substrates, plastic substrates, and the like. Further, although the illustrative embodiment is a thermal evaporation system, one skilled in the art will recognize, after reading this Specification, that the present invention can be directed toward virtually any material-deposition process, such as e-beam evaporation, sputtering, and the like. Still further, although the depicted example is a deposition system suitable for use in single-substrate planar processing, the present invention is also suitable for use in other fabrication approaches, such as cluster-tool processing, track processing, roll-to-roll processing, reel-to-reel processing, etc. As a result, the present invention is suitable for use in myriad applications including, without limitation, packaging applications, IC fabrication, MEMS fabrication, nanotechnology device fabrication, ball-grid array (BGA) fabrication, and the like.

In the depicted example, shadow mask 106 is a high-precision shadow mask comprising handle substrate 224 and membrane 226, which is suspended over a central opening formed in the handle substrate. Membrane 226 includes through-hole pattern 228. Shadow mask 106 includes two major surfaces—front surface 230 and back surface 232. Front surface 230 is the top surface of membrane 226 (i.e., the membrane surface distal to handle substrate 224), which defines plane 118. Back surface 232 is the surface of handle substrate 224 (i.e., the substrate surface distal to membrane 226). It should be noted that, while shadow mask 106 is a high-precision, membrane-based shadow mask, mask chucks in accordance with the present invention can be used to hold virtually any type of shadow mask. Preferably, membrane 226 comprises silicon nitride; however, other materials can be used without departing from the scope of the present invention. Preferably, membrane 226 has a thickness that is less than or equal to one micron; however, other thicknesses can be used for the membrane without departing from the scope of the present invention.

As discussed above, by employing a shadow-mask membrane having a thickness of one micron or less can reduce shadowing effects during direct deposition as compared to prior-art shadow masks.

Vacuum chamber 202 is a conventional pressure vessel for containing a low-pressure environment required for the evaporation of material 116. In the depicted example, vacuum chamber 110 is a standalone unit; however, it can also be realized as a part of a cluster deposition system or track-deposition system where multiple evaporation chambers are arranged in linear chain without departing from the scope of the present invention. In some embodiments, vacuum chamber 110 includes several evaporation sources/shadow mask combinations that enable formation of different patterns of different materials on substrate 102, such as, for example, multiple light-emitting subpixels that emit light at different colors (e.g., red, green, and blue).

Controller 240 is a conventional instrument controller that, among other things, provides control signals 236 and 238 to substrate chuck 204 and mask chuck 206, respectively.

Figure 3:
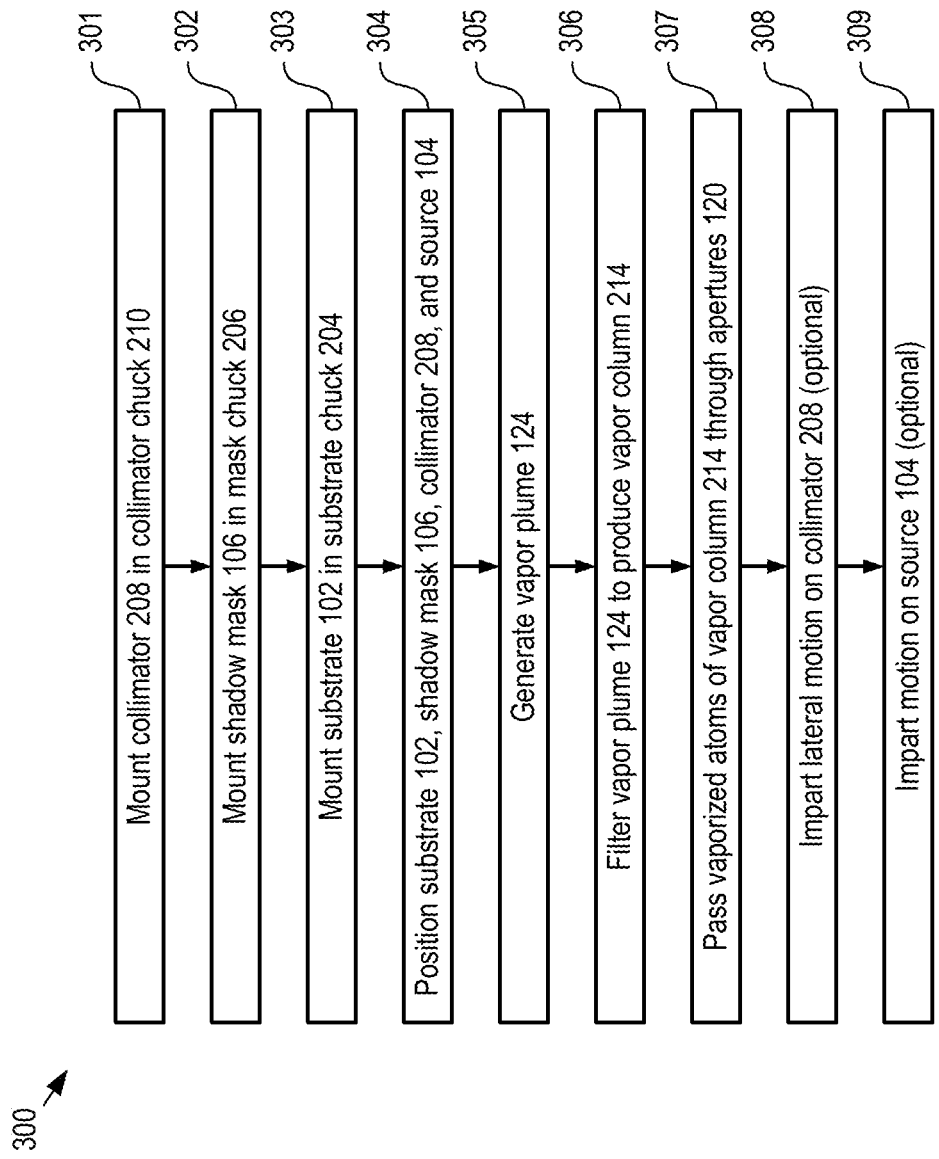
FIG. 3 depicts operations of a method for depositing a directly patterned layer of material on a substrate in accordance with the illustrative embodiment.

FIG. 3 depicts operations of a method for depositing a directly patterned layer of material on a substrate in accordance with the illustrative embodiment. Method 300 is described herein with continuing reference to FIG. 2, as well as reference to FIGS. 4A-B, 5, 6A-B, 7A-B, 8A-B, 9, 10 and 11A-C. Method 300 begins with operation 301, wherein collimator 208 is mounted in collimator chuck 210.

Collimator 208 is a mechanically robust plate comprising a plurality of channels that are separated by thin walls, as described in more detail below and with respect to FIGS. 11A-C. Collimator 208 is dimensioned and arranged to function as a spatial filter that selectively passes vaporized atoms propagating along directions that are nearly normal to plane 108 (i.e., that have very small propagation angles). Collimator 202, therefore, mitigates feathering across the entirety of substrate 102.

Collimator chuck 210 is an annular clamping mechanism for holding and locating the collimator relative to shadow mask 106.

At operation 302, shadow mask 106 is mounted in mask chuck 206.

Mask chuck 206 is a fixture for holding shadow mask 106 via an attractive force imparted on only its back surface. In the depicted example, mask chuck 206 holds shadow mask 106 using electrostatic force. In some embodiments, mask chuck 206 holds a shadow mask via a different attractive force, such as a vacuum-generated force, a magnetic force, etc. In other embodiments, mask chuck 206 is a mechanical clamp.

FIGS. 4A-B depicts a schematic drawings of top and cross-section views, respectively, of a mask chuck in accordance with the illustrative embodiment. The cross-section depicted in FIG. 4B is taken through line a-a shown in FIG. 4A. Mask chuck 206 includes frame 402, electrodes 404-1 and 404-2, and pads 406.

Frame 402 is a structurally rigid circular ring of electrically insulating material. Frame 402 surrounds opening 408, which is sufficiently large to expose the entirety of through-hole pattern 228. In some embodiments, frame 402 has a shape other than circular, such as square, rectangular, irregular, etc. In some embodiments, frame 402 comprises an electrically conductive material that is coated with an electrical insulator.

Electrodes 404-1 and 404-2 are electrically conductive elements formed on the surface of frame 402. Electrodes 404-1 and 404-2 are electrically coupled with controller 240.

Pads 406 are structurally rigid plates of electrically insulating material disposed on electrodes 404-1 and 404-2. Each of pads 406 includes mounting surface 410, against which shadow mask 106 is held when mounted in the mask chuck.

Figure 5:
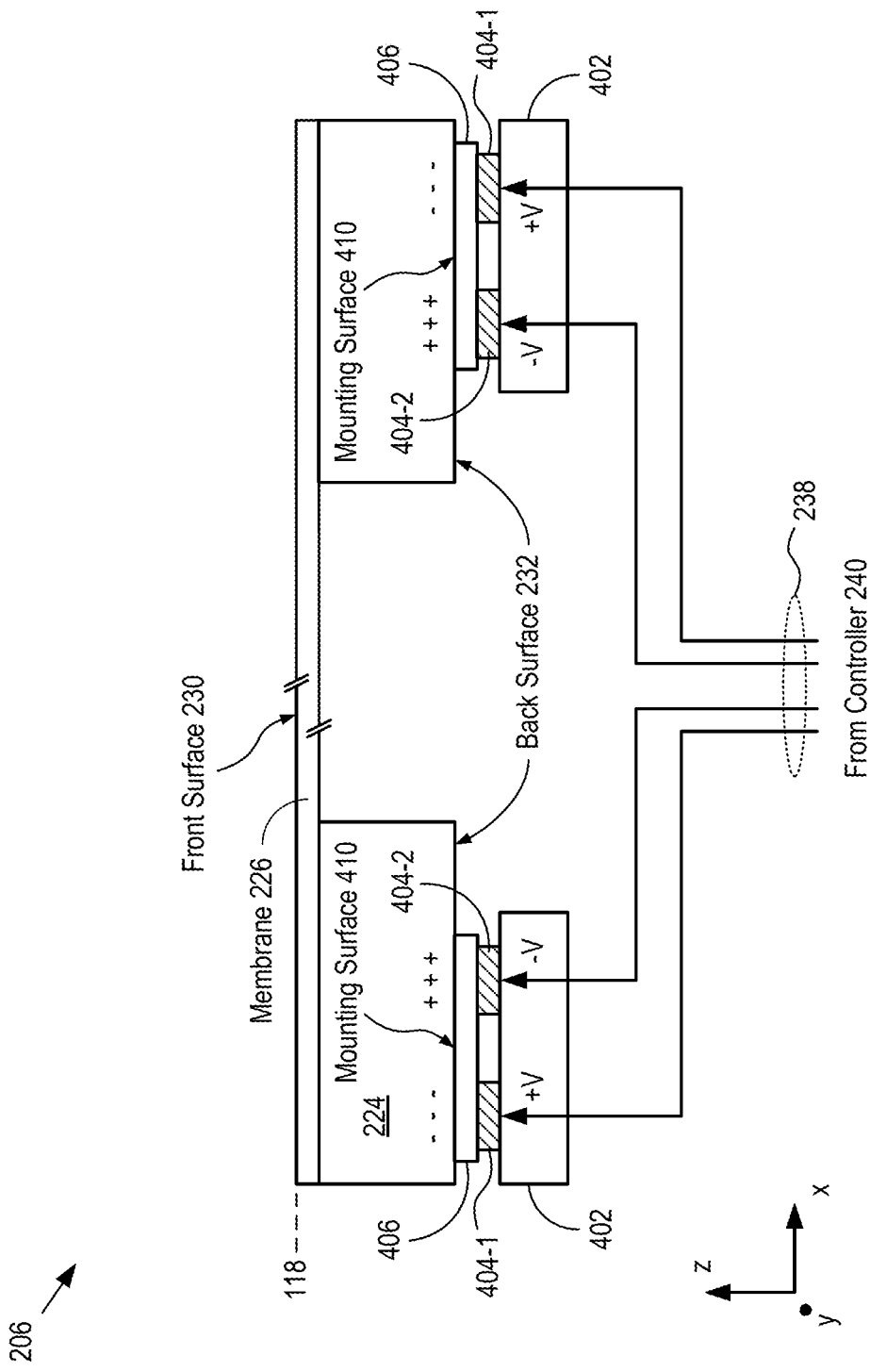
FIG. 5 depicts a cross-sectional view of shadow mask 106 mounted in mask chuck 206.

FIG. 5 depicts a cross-sectional view of shadow mask 106 mounted in mask chuck 206.

Shadow mask 106 is held in mask chuck 206 by an electrostatic force imparted between mounting surface 410 and back surface 232. The electrostatic force arises in response to a voltage potential between electrodes 404-1 and 404-2, which is generated by control signal 238. When back surface 232 is brought into contact with mounting surface 410, sympathetic charge regions develop within handle substrate 224 as shown. As a result, the electrostatic force is selectively imparted between back surface 232 and mounting surface 410.

Typically, shadow mask 106 is supported only around its perimeter. As a result, shadow masks in the prior art tend to sag under gravitational forces. In some embodiments, mask chucks in accordance with the present invention include one or more features that mitigate or eliminate gravity-induced sag of a shadow mask when the shadow mask is mounted. As discussed in detail above, a shadow mask can sag by several microns in the center due to its own mass and the effect of gravity. This gravity-induced sag leads to several significant issues that exacerbate feathering. First, it increases the separation between the shadow mask and the substrate in the center of the deposition region, which is typically centered on the shadow mask. As discussed above, feathering increases with substrate/shadow mask separation distance. Second, it leads to a non-uniform separation between the substrate and the shadow mask, which gives rise to a variation in the degree of feathering that occurs across the substrate surface. The non-uniformity makes it difficult, if not impossible, to compensate for feathering via creative mask layout.

It is yet another aspect of the present invention that a mask chuck can include features that mitigate gravity-induced sag of a shadow mask.

In some embodiments, mask chuck 206 includes a slight curvature (e.g., an upward slope) that biases the shadow mask upward to counteract shadow-mask sag due to gravity. In some embodiments, a fine support structure may extend across the opening in mask chuck 206 to support the mask and reduce the gravitational sag. These features are described in more detail below and with respect to FIGS. 6A-B and 7A-B.

Figure 6A:
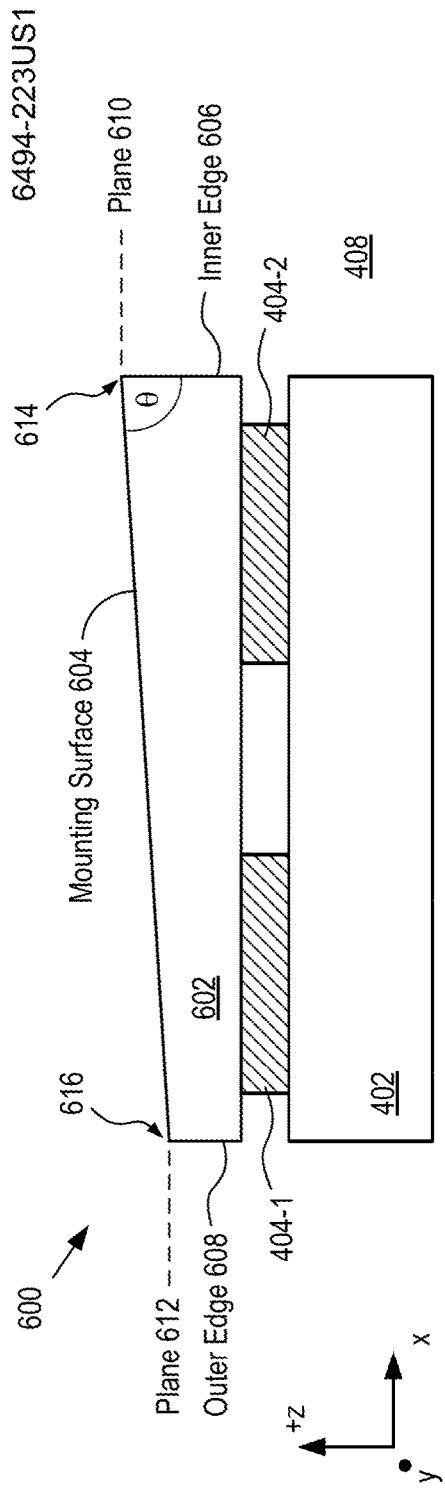
FIG. 6A depicts a schematic drawing of a cross-sectional view of a portion of a mask chuck 206 in accordance with a first alternative embodiment of the present invention.
Figure 6B:
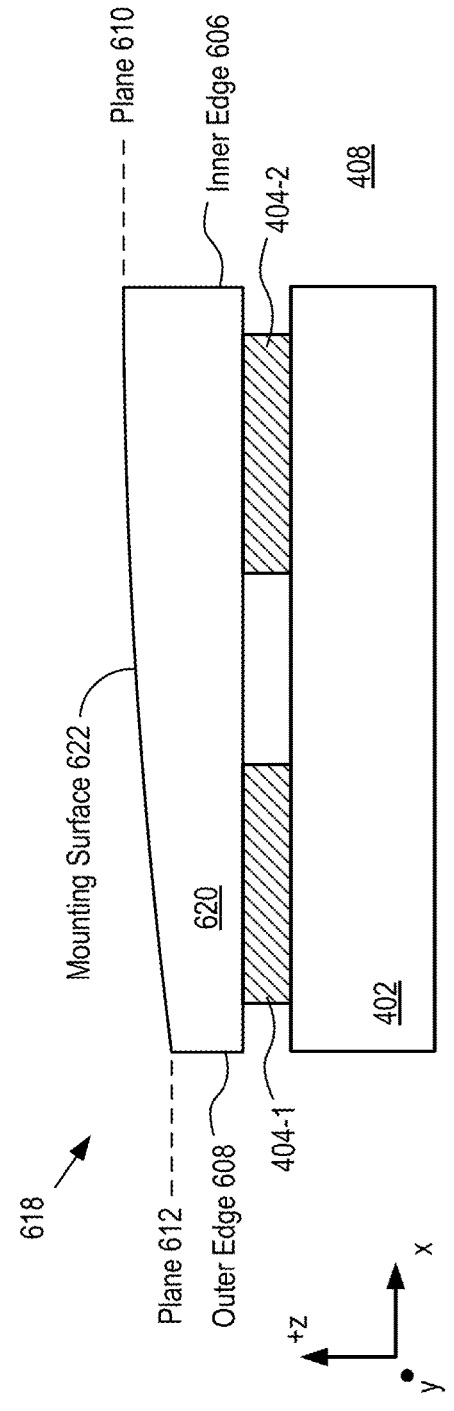
FIG. 6B depicts a schematic drawing of a cross-sectional view of a portion of a mask chuck 206 in accordance with a second alternative embodiment of the present invention.

FIG. 6A-B depicts a schematic drawing of a cross-sectional view of a portion of a mask chuck in accordance with a first alternative embodiment of the present invention. The cross-section depicted in FIG. 6A is taken through line a-a shown in FIG. 4A. Mask chuck 600 includes frame 402, electrodes 404-1 and 404-2, and pads 602.

Pads 602 are analogous to pads 406 described above; however, each pad 602 has a mounting surface that is designed to induce or increase tensile strain in the shadow-mask when it is mounted in the mask chuck. Pad 602 has mounting surface 604, which is linearly tapered downward from inner edge 606 (i.e., the edge proximal to opening 408) to outer edge 608. In other words, mounting surface 604 tapers in the negative z-direction, as shown, from point 614 to point 616 (i.e., from its highest point at which it meets inner edge 606 at plane 610 to its lowest point at which it meets outer edge 608 at plane 612). In embodiments in which inner edge 606 is perpendicular to plane 610, therefore, inner edge 606 and mounting surface 604 form interior angle, e, such that it is an acute angle.

When shadow mask 106 is held in mask chuck 600, back surface 232 is attracted to mounting surface 604, thereby inducing a curvature in the shadow mask that increase the laterally directed tension in front surface 230 of the shadow mask. As a result, the membrane is pulled tighter and gravity-induced sag is reduces or eliminated.

FIG. 6B depicts a schematic drawing of a cross-sectional view of a portion of a mask chuck in accordance with a second alternative embodiment of the present invention. The cross-section depicted in FIG. 6B is taken through line a-a shown in FIG. 4A. Mask chuck 618 includes frame 402, electrodes 404-1 and 404-2, and pads 720.

Pads 620 are analogous to pads 406 described above; however, like pads 602, each pad 620 has a mounting surface that is designed to induce or increase tensile strain in the shadow-mask when it is mounted in the mask chuck. Pad 620 has mounting surface 622, which curves downward (i.e., in the negative z-direction, as shown) from inner edge 606 to outer edge 608. In other words, mounting surface 622 tapers in the negative z-direction, as shown, from point 614 to point 616.

When shadow mask 106 is held in mask chuck 618, back surface 232 is attracted to mounting surface 622, thereby inducing a curvature in the shadow mask that increase the laterally directed tension in front surface 230 of the shadow mask. As a result, the membrane is pulled tighter and gravity-induced sag is reduces or eliminated. In some embodiments, the amount of additional tension induced in front surface 230 can be controlled by controlling the magnitude of the voltage differential applied to electrodes 404-1 and 404-2.

It will be clear to one skilled in the art, after reading this Specification, that the directions in which mounting surfaces 604 and 622 slope (or curve) would be reversed for a deposition system in which the mask were mounted upside down as compared to its orientation depicted in FIG. 1. Further, in such a configuration, it would typically be necessary that substrate chuck 204 be designed to enable substrate 102 to reside within opening 408 to enable a substrate/shadow mask separation of less than or equal to 10 microns.

Figures 7A, 7B:
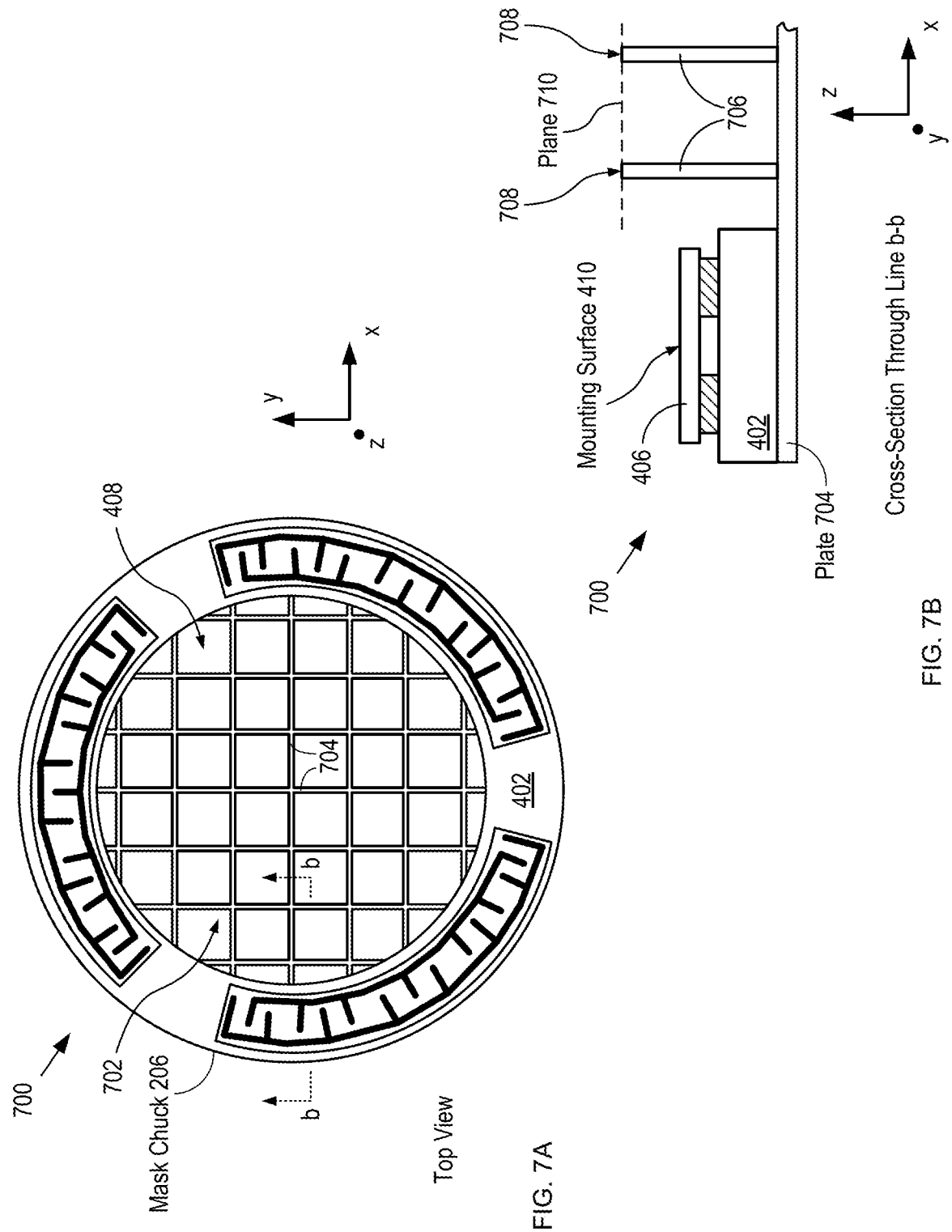
FIGS. 7A-B depict schematic drawings of top and cross-section views, respectively, of a mask chuck in accordance with a third alternative embodiment of the present invention.

FIGS. 7A-B depict schematic drawings of top and cross-section views, respectively, of a mask chuck in accordance with a third alternative embodiment of the present invention. Mask chuck 700 includes mask chuck 206 and support grid 702.

Support grid 702 includes plate 704 and support ribs 706.

Plate 704 is a rigid plate from which support ribs 706 extend. In some embodiments, plate 704 and support ribs 706 are machined from a solid body of structural material. Materials suitable for use in plate 704 and support ribs 706 include, without limitation, metals, plastics, ceramics, composite materials, glasses, and the like. Plate 704 is designed to mount to frame 402 to locate support grid 702 within opening 408 such that it mechanically supports membrane 226 when shadow mask 106 is mounted in mask chuck 700.

Support ribs 706 are arranged to support shadow mask 106 in regions that lie between the through-holes of through-hole arrangement 228. Typically, the through-holes of a shadow mask are arranged in clusters that correspond to different die regions on the substrate. Since these die regions are usually separated by "lanes" intended for removal by a dicing saw, support ribs 706 are preferably arranged to match the arrangement of these lanes. It should be noted, however, that any suitable arrangement of support ribs can be used in support grid 702.

Support grid 702 is formed such that their top surfaces 708 are coplanar and define plane 710. Plane 710 lies above mounting surface 410 by a distance equal to the thickness of handle substrate 224. As a result, when handle substrate 224 is in contact with mounting surface 410, support ribs 706 are in contact with membrane 226.

In some embodiments, shadow mask 106 is held upside down in mask chuck 700 such that membrane 226 is in contact with mounting surface 410. In such embodiments, support grid 702 is designed to fit within opening 408 such that plane 710 is coplanar with mounting surface 410. As a result, membrane 226 is supported by support grid 702 such that it is perfectly level all the way across opening 408.

At operation 303, substrate 102 is mounted in substrate chuck 204.

Substrate chuck 204 is a platen for holding substrate 102 via an attractive force applied only to its back surface. In the depicted example, substrate chuck 204 generates electrostatic force to hold a substrate; however, in some embodiments, substrate chuck 204 holds a substrate via a different attractive force, such as a vacuum-generated force, a magnetic force, etc. For the purposes of this Specification, including the appended claims, the term "magnetic force" includes any force arising from the use of permanent magnets and/or electromagnets. Substrate chuck 204 is described in more detail below and with respect to FIGS. 8A-B.

In some embodiments, substrate chuck 204 is dimensioned and arranged to contact substrate 102 only from the front surface to mitigate interference with the deposition of material on the other side of the substrate. In some embodiments, substrate chuck 204 secures the substrate via a different means, such as vacuum, mechanical clamps, from both sides of the substrate, etc. In some embodiments, substrate chuck 204 includes in-situ gap sensors that operate, with positioning system 212 to control the spacing and degree of parallelism between substrate 102 and shadow mask 106.

In the depicted example, substrate 102 is a glass substrate suitable for use in active-matrix organic-light-emitting-diode (AMOLED) displays. Substrate 102 includes two major surfaces—back surface 115 and front surface 114, on which the display elements are defined. Front surface 114 defines plane 108.

FIG. 8A depicts a schematic drawing of a cross-sectional view of a substrate chuck in accordance with the illustrative embodiment. Substrate chuck 204 includes platen 802 and electrodes 804-1 and 804-2.

Platen 802 is a structurally rigid platform comprising substrate 806 and dielectric layer 808. Each of substrate 806 and dielectric layer 808 includes an electrically insulating material, such as glass, ceramic, anodized aluminum, composite materials, Bakelite, and the like to electrically isolate electrodes 804-1 and 804-2 from each other and from substrate 102 when it is mounted in the substrate chuck.

Electrodes 804-1 and 804-2 are electrically conductive elements formed on the surface of substrate 806 and overcoated by dielectric layer 808 to embed them within platen 802. Electrodes 804-1 and 804-2 are electrically coupled with controller 240. It should be noted that electrodes 804-1 and 804-2 are depicted as simple plates; however, in practice, substrate chuck 204 can have electrodes that are shaped in any manner, such as interdigitated comb fingers, concentric rings, irregular shapes, etc.

Dielectric layer 808 is a structurally rigid layer of glass disposed over electrodes 804-1 and 804-2 to give rise to mounting surface 810.

FIG. 8B depicts a schematic drawing of a cross-sectional view of substrate chuck 204 while holding substrate 102.

To hold substrate 102 in substrate chuck 204, control signal 236 generates a voltage potential between electrodes 804-1 and 804-2. When back surface 115 is brought into contact with mounting surface 810 (i.e., the top surface of dielectric layer 808), sympathetic charge regions develop within substrate 102 as shown. As a result, an electrostatic force is selectively imparted on back surface 115, thereby attracting it to mounting surface 610.

Although the illustrative embodiment includes a substrate chuck that holds substrate 102 via electrostatic force, it will be clear to one skilled in the art, after reading this Specification, how to specify, make, and use alternative embodiments wherein a substrate is held in a substrate chuck via an attractive force other than an electrostatic force, such as a vacuum-generated force, a magnetic force, and the like.

At operation 304, the relative positions of substrate 102, source 104, shadow mask 106, and collimator 208 are controlled by positioning system 212.

Positioning system 212 aligns substrate 102 and shadow mask 106 by controlling the position of substrate chuck 204. In some embodiments, positioning system aligns the substrate and shadow mask by controlling the position of mask chuck 206. In some embodiments, the positions of both chucks is controlled to align the substrate and shadow mask. Operation 304 and positioning system 212 are described in more detail below and with respect to FIGS. 1, 2, 9, 10 and 11A-C.

The positioning system includes three six-axis manipulators and an optical alignment system to control the alignment between substrate 102 and shadow mask 106. Each of the six-axis manipulators is operatively connected with each of substrate chuck 204, mask chuck 206, and collimator chuck 210 to control its position along and rotation about each of the x-, y-, and z-axes. In some embodiments, the position of at least one of mask chuck 206 and collimator chuck 210 is not controlled by a six-axis positioner. In some embodiments, positioning system 212 also includes a rotation stage for controlling the relative rotational alignment of substrate 102 and shadow mask 106.

In operation 304, positioning system 212 locates the substrate and shadow mask such that deposition sites, R, in deposition region 216 are aligned with apertures 120, planes 108 and 118 are parallel and the separation, s, between the substrate and shadow mask is as close to zero (i.e., in contact) as possible—preferably within a few microns (e.g., 1-5 microns). In some embodiments, s is another suitable separation distance. It should be noted that, for clarity, separation, s, is depicted larger than is typical.

It is an aspect of the present invention that, in some embodiments, neither substrate chuck 204 nor mask chuck 206 includes any structural element that projects past its respective mounting surface. As a result, a substrate and shadow mask can be aligned with little or no separation between them to mitigate feathering during deposition. One skilled in the art will recognize that in conventional direct-deposition systems, the separation between substrate and shadow mask must be at least a few tens, or even hundreds, of microns.

Figure 9:
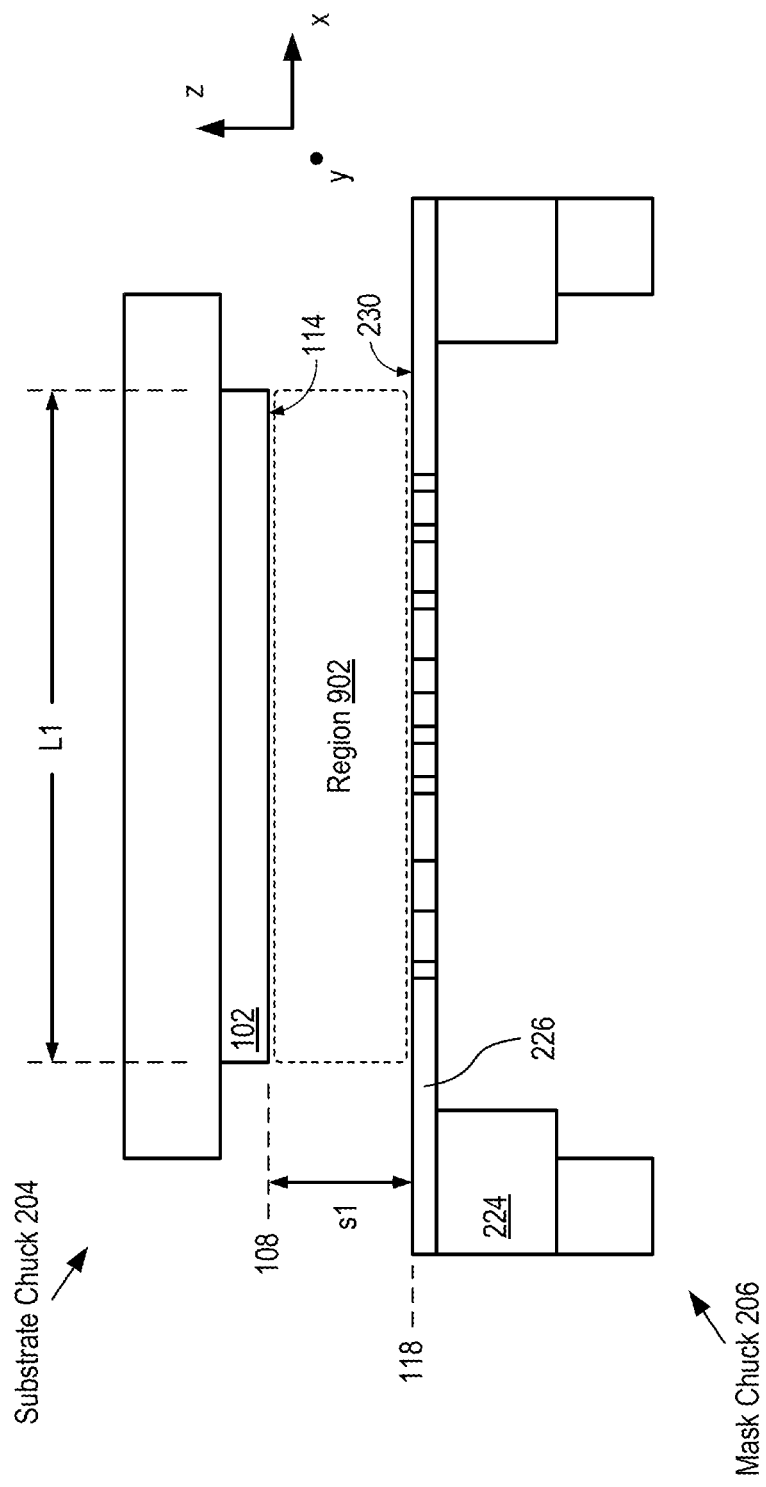
FIG. 9 depicts a schematic drawing of a cross-sectional view of a portion of system 100 with substrate 102 and shadow mask 106 in alignment for deposition of material 116.

FIG. 9 depicts a schematic drawing of a cross-sectional view of a portion of system 100 with substrate 102 and shadow mask 106 in alignment for deposition of material 116.

When the substrate and shadow mask are aligned, they collectively define region 902 between them. Region 902 has a lateral extent, L1, which is equal to that of front surface 114. Region 902 also has a thickness that is equal to the separation, s1, between planes 108 and 118 (i.e., the separation between the substrate and the shadow mask).

Because no portion of substrate chuck 204 extends past plane 108 into region 902, there is no obstruction between the substrate and shadow mask. As a result, separation, s1, between substrate 102 and shadow mask 106 can be extremely small (10 microns). In fact, if desired, the substrate and shadow mask can be brought into contact with one another. The ability to perform direct patterning with a substrate/shadow mask separation equal to or less than 10 microns affords embodiments of the present invention particular advantage over prior-art direct-patterning deposition systems because it enables feathering to be significantly reduced or even eliminated. In some embodiments, there is no separation, or a zero gap, between the substrate and shadow mask in order to eliminate feathering altogether.

At operation 305, source 104 generates vapor plume 124. As described above and with respect to FIG. 1, the propagation angles, $\theta p$, of the vaporized atoms of vapor plume 124 span a relatively large angular range of $-\theta m$ to $+\theta m$. In the prior art, this large angular range exacerbates feathering, which is a function of the lateral and rotation alignments between substrate 102 and shadow mask 106, the separation, s, between them, and the range of propagation angles, Op, of the vaporized atoms incident on the shadow mask.

In the present invention, however, the range of propagation angles for the vaporized atoms that reach the substrate surface is reduced by locating a spatial filter (i.e., collimator 208) in their path from source 104 to shadow mask 106. The inclusion of collimator 208 in system 200, therefore, significantly reduces feathering during direct deposition.

Figure 10:
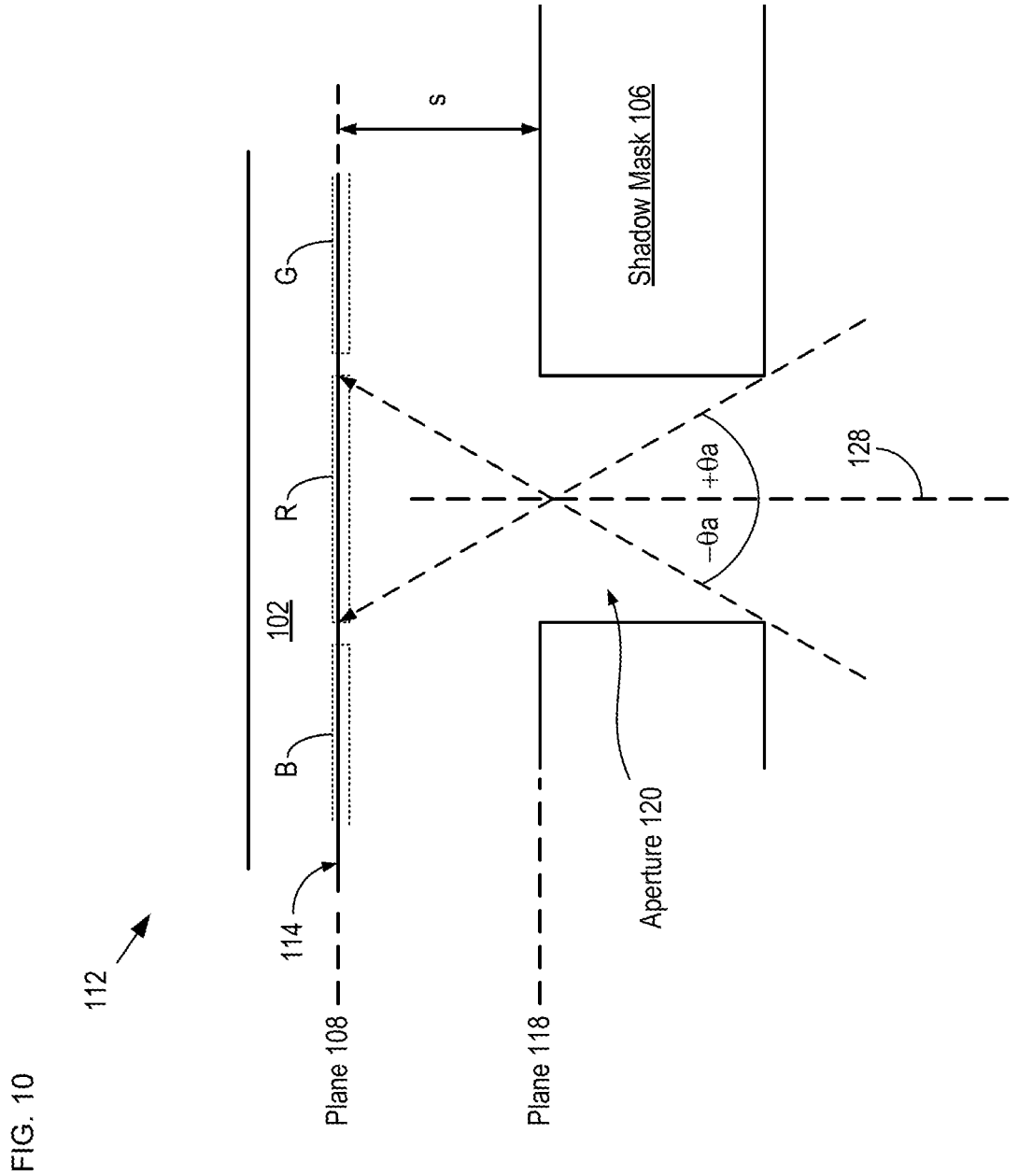
FIG. 10 depicts a schematic drawing of an enlarged view of a pixel region of substrate 102 and its corresponding aperture 120 of shadow mask 106.

FIG. 10 depicts a schematic drawing of an enlarged view of a pixel region 112 of substrate 102 and its corresponding aperture 120 of shadow mask 106. As shown in the figure, for perfect fidelity between aperture 120 and the deposition of material on deposition site, R, the propagation angles of vaporized atoms passed by shadow mask 106 must be within the acceptable range of $-\theta a$ to $+\theta a$. For the purposes of this Specification, including the appended claims, the term "acceptable angular range" is defined as the range of propagation angles that is desired to be passed by the shadow mask, which spans the angular range from $-\theta a$ to $+\theta a$. Typically, the acceptable angular range is that range of angles that enables material 116 to deposit only on deposition sites R after passing through apertures 120. In some embodiments, the acceptable angular range includes a small guard band around the deposition sites to allow for feathering that is less than half the spacing between the closest deposition sites. Any vaporized atom incident on the shadow mask having a propagation angle outside this range would deposit on surface 114 beyond the lateral extent of deposition site R.

At operation 306, vapor plume 124 is filtered by collimator 208 to give rise to vapor column 214.

FIG. 11A depicts a schematic drawing of a cross-sectional view of a collimator in accordance with the illustrative embodiment. Collimator 208 includes body 1102, which is patterned to form a plurality of channels 1104, each of which extends through the thickness of body 1102.

Body 1102 is a glass plate suitable for planar processing. In the depicted example, body 1102 has a thickness of approximately 25 millimeters (mm); however, any practical thickness can be used without departing from the scope of the present invention. In some embodiments, body 1102 comprises a different structurally rigid material that is suitable for withstanding the temperatures associated with thermal and/or e-beam evaporation without significant deformation. Materials suitable for use in body 1102 include, without limitation, semiconductors (e.g., silicon, silicon-carbide, etc.), ceramics (e.g., alumina, etc.), composite materials (e.g., carbon fibers, etc.), fiber glass, printed circuit board, metals, polymers (e.g., polyetheretherketone (PEEK), etc.), and the like.

Channels 1104 are through-holes formed in body 1102 using a conventional processing operation, such as metal forming, drilling, electron-discharge machining, deep reactive-ion etching (DRIE), and the like. In the depicted example, channels 1104 have a circular cross-section with a diameter of approximately 3 mm. Channels 1104, therefore, have a height-to-width aspect ratio of approximately 8:1. Preferably, the height-to-width aspect ratio is at least equal to 3:1. In addition, for height-to-width aspect ratios that exceed 100:1, the flow of vaporized atoms through the collimator begins to diminish to undesirable levels; however, height-to-width aspect ratios in excess of 100:1 are within the scope of the present invention. In some embodiments, channels 1104 have a cross-sectional shape other than circular (e.g., square, rectangular, hexagonal, octagonal, irregular, etc.).

The formation of channels 1104 give rise to a plurality of walls 1106, which reside between the channels. Preferably, to enable high throughput, walls 1106 are as thin as possible without sacrificing the structural integrity of body 1102. In the depicted example, walls 506 have an average thickness of approximately 500 microns; however, any practical thickness can be used for walls 1106.

FIGS. 11B-C depict schematic drawings of top and sectional views, respectively, of a region of collimator 208. Channels 1106 are arranged in a honeycomb arrangement wherein columns are periodic and adjacent columns are offset from their neighbors by a half period. In some embodiments, the channels are arranged in a different arrangement, such as two-dimensional periodic, hexagonally close-packed, random, and the like.

As depicted in FIG. 11C, the aspect ratio of channel 1104 defines a filtered angular range. For the purposes of this Specification, including the appended claims, the term "filtered angular range" is defined as the range of propagation angles that will pass through collimator 208, which spans the angular range from $-\theta c$ to $+\theta c$. As a result, a vaporized atom having a propagation angle larger than $|\theta c|$ will be blocked by the collimator.

One skilled in the art will recognize that the dimensions provided above for body 1102, channels 1104, and walls 1106 are merely exemplary and that other dimensions can be used without departing from the scope of the present invention.

At operation 307, apertures 120 pass vaporized atoms of vapor column 214 such that they deposit on deposition sites R in deposition region 216.

At optional operation 308, positioning system 212 imparts motion on collimator 208 to improve the uniformity of vaporized-atom density across the lateral extent of vapor column 214, thereby improving the deposition uniformity across the deposition sites on substrate 102. In some embodiments, positioning system 212 is operative for imparting an oscillating motion to collimator 208.

It should be noted that, in the illustrative embodiment, source 104 is substantially a point source for material 116 because the open area of its crucible is significantly smaller than the area of substrate 102.

At optional operation 309, positioning system 212 moves source 102 in the x-y plane, relative to the substrate, to improve deposition uniformity.

In some embodiments, source 104 is a linear evaporation source that comprises a plurality of nozzles that emits a fan-shaped vapor plume of vaporized atoms. In some embodiments, positioning system 212 moves the linear source along a direction that is unaligned with its longitudinal axis in the x-y plane to improve the uniformity of the deposited material on substrate 102. In some embodiments, this path is a line that is substantially orthogonal to both the linear arrangement of nozzles and normal axis 110. In some of embodiments, the linear source is moved along a non-linear path in the x-y plane.

In some embodiments, source 104 includes a two-dimensional arrangement of nozzles, each of which emits a conically shaped vapor plume such that the plurality of nozzles collectively provides a flow of vaporized atoms that is substantially uniform over the area of the substrate surface. In some embodiments, positioning system 212 moves the two-dimensional arrangement of nozzles to facilitate deposition uniformity. In some embodiments, the two-dimensional arrangement of nozzles is rotated in-plane to facilitate deposition uniformity.

In some embodiments, source 104 is a two-dimensional planar source that includes a layer of material 116 distributed across its top surface. The source is arranged such that this top surface is parallel to and facing substrate 102. When heated, material 116 vaporizes uniformly across the plane. Exemplary planar evaporation sources suitable for use in embodiments of the present invention are disclosed by Tung, et al., in "OLED Fabrication by Using a Novel Planar Evaporation Technique," *Int. J. of Photoenergy*, Vol. 2014 (18), pp. 1-8 (2014), which is incorporated herein by reference.

In some embodiments, to improve the uniformity with which material 116 deposits over the two-dimensional area of surface 114, positioning system 212 imparts a relative motion between source 104 and the combination of substrate 102 and shadow mask 106 by moving at least one of the substrate/mask combination and the source.

It is to be understood that the disclosure teaches just some embodiments in accordance with the present invention and that many variations of the invention can easily be devised by those skilled in the art after reading this disclosure and that the scope of the present invention is to be determined by the following claims.

What is claimed is:

1. A system for depositing a first material on a plurality of deposition sites in a deposition region of a substrate, the plurality of deposition sites being arranged in a first arrangement, wherein the substrate includes a first major surface and a second major surface that comprises the deposition region, the system comprising:
    a source for providing a first plurality of vaporized atoms of the first material, each vaporized atom of the first plurality thereof propagating along a propagation direction that is characterized by a propagation angle relative to a first direction that is normal to a first plane defined by the substrate, wherein the range of propagation angles of the first plurality of vaporized atoms spans a first angular range;
    a shadow mask having a back surface that defines a third major surface and a front surface that defines a fourth major surface, the shadow mask comprising (i) a handle substrate having a central opening and a first thickness at an inner edge of the central opening and (ii) a membrane having a uniform second thickness and comprising a plurality of through-holes arranged in the first arrangement, the membrane being suspended over the central opening, wherein the handle substrate includes the third major surface and the third major surface is distal to the membrane, and wherein the membrane includes the fourth major surface and the fourth major surface is distal to the handle substrate;
    a first chuck for holding the substrate, the first chuck being dimensioned and arranged to selectively impart a first attractive force on the first major surface;
    a second chuck for holding the shadow mask, the second chuck comprising: (1) a frame that surrounds a first opening that enables the material to pass through the second chuck to the through-holes and (2) a plurality of pads disposed on the frame, the plurality of pads collectively defining a mounting surface that surrounds at least a major portion of the first opening and is in contact with and selectively imparts a second attractive force on the third major surface when the shadow mask is held in the second chuck, wherein each pad has a cross-section that defines an inner edge of the mounting surface that is proximal to the first opening and an outer edge of the mounting surface that is distal to the first opening, and wherein the mounting surface and inner edge meet at a first point that defines a second plane;
    a support grid located in the first opening, the support grid comprising a plurality of support ribs fixedly attached to a bottom of the frame, each support rib having a top surface that is in contact with and supports the membrane when the shadow mask is held in the second chuck, wherein the plurality of top surfaces collectively defines a third plane, and wherein the support ribs project above the second plane such that the third plane and second plane are separated by a distance equal to the first thickness;
    a collimator comprising a plurality of channels, the collimator being between the source and the shadow mask, wherein each channel of the plurality thereof is dimensioned and arranged to pass only vaporized atoms having a propagation angle within a second angular range that is smaller than the first angular range; and
    a positioning system for controlling the relative position of the first chuck and the second chuck to align the shadow mask and the substrate.

2. The system of claim 1 wherein the frame is circular.

3. The system of claim 1 wherein the plurality of pads is arranged radially about the first opening.

4. The system of claim 1 wherein the plurality of deposition sites and the plurality of through-holes collectively define an acceptable angular range, and wherein the second angular range is less than or equal to the acceptable angular range.

5. The system of claim 1 wherein each of the plurality of channels is characterized by a height-to-width aspect ratio that is equal to or greater than approximately 3:1.

6. The system of claim 1 wherein each of the plurality of channels is characterized by a height-to-width aspect ratio that is equal to or greater than 8:1.

7. The system of claim 1 wherein the positioning system is operative for imparting a relative motion between the substrate and the collimator.

8. The system of claim 1 wherein the first chuck, second chuck, and positioning system collectively enable alignment of the substrate and shadow mask with a separation between them that is less than or equal to approximately 10 microns.

9. The system of claim 8 wherein the first chuck, second chuck, and alignment system collectively enable alignment of the substrate and shadow mask with a separation between them that is greater than 0 microns and less than or equal to approximately 10 microns.

10. The system of claim 1 wherein the first chuck, second chuck, and alignment system collectively enable alignment of the substrate and shadow mask with a separation between them that is within the range of approximately 2 microns to approximately 5 microns.

11. The system of claim 1 wherein second chuck selectively imparts a second attractive force on the third major surface, and wherein the second attractive force is an electrostatic force.

12. The system of claim 1 wherein the mounting surface and the outer edge meet at a second point that defines a fourth plane that is further from the substrate than the second plane when the shadow mask and substrate are aligned.

13. The system of claim 12 wherein the second chuck includes a plurality of electrode pairs, each electrode pair being located between the frame and a different pad of the plurality thereof, the plurality of electrode pairs being configured to generate the second attractive force as an electrostatic force having a first magnitude that is controllable, and wherein a second magnitude of the tension induced in the fourth major surface is based on the first magnitude.

14. The system of claim 13 wherein the mounting surface is non-linear.

15. The system of claim 1 wherein the membrane comprises silicon nitride.

16. The system of claim 1 wherein the second thickness is less than or equal to 1 micron.

17. A system for depositing a first material on a plurality of deposition sites in a deposition region of a substrate, the plurality of deposition sites being arranged in a first arrangement, wherein the substrate includes a first major surface and a second major surface having a two-dimensional area and defining a first plane and a first direction that is normal to the first plane, the system comprising:
 a source that is operative for providing a first plurality of vaporized atoms, each vaporized atom of the first plurality thereof traveling along a propagation direction that defines a propagation angle relative to the first direction, wherein the first plurality of vaporized atoms is characterized by a first plurality of propagation angles that span a first angular range;
 a shadow mask having a back surface that defines a third major surface and a front surface that defines a fourth major surface, the shadow mask comprising (i) a handle substrate having a single central opening and a first thickness at an inner edge of the central opening and (ii) a membrane having a uniform second thickness and comprising a plurality of through-holes arranged in the first arrangement, the membrane being suspended over the central opening, wherein the handle substrate includes the third major surface and the third major surface is distal to the membrane, and wherein the membrane includes the fourth major surface and the fourth major surface is distal to the handle substrate, wherein the shadow mask and the plurality of deposition sites collectively define an acceptable angular range that is less than the first angular range;
 a first chuck for holding the substrate via a first attractive force that is selectively imparted on the first major surface;
 a second chuck for holding the shadow mask, the second chuck comprising: (1) a frame that surrounds a first opening that enables the material to pass through the second chuck to the through-holes and (2) a plurality of pads disposed on the frame, the plurality of pads collectively defining a mounting surface that is in contact with and selectively imparts a second attractive force on the third major surface when the shadow mask is held in the second chuck, wherein the mounting surface surrounds at least a major portion of the first opening, and wherein each pad has a cross-section that defines an inner edge of the mounting surface that is proximal to the first opening, and wherein the mounting surface and inner edge meet at a first point that defines a second plane;
 a support grid located in the first opening, the support grid comprising a plurality of support ribs fixedly attached to a bottom of the frame, each support rib having a top surface that is in contact with the membrane such that the plurality of support ribs supports the membrane when the shadow mask is held in the second chuck, wherein the plurality of top surfaces collectively defines a third plane, and wherein the support ribs project above the second plane such that the third plane and second plane are separated by a distance equal to the first thickness;
 wherein, when the shadow mask and substrate are aligned, the second major surface and the shadow mask are separated by a first separation and no portion of the first chuck extends past the first plane toward the shadow mask;
 wherein the first chuck and second chuck are dimensioned and arranged to enable the first separation to be less than 10 microns; and
 a collimator that is located between the source and the shadow mask, the collimator comprising a plurality of channels that selectively pass a second plurality of vaporized atoms, the first plurality of vaporized atoms including the second plurality of vaporized atoms, wherein each channel of the plurality thereof having a height-to-width aspect ratio that defines a filtered angular range that is less than or equal to the acceptable angular range, and wherein the second plurality of vaporized atoms is characterized by a second plurality of propagation angles that is less than or equal to the filtered angular range.

18. The system of claim 17 wherein the source comprises a plurality of nozzles for emitting the plurality of vaporized atoms, the plurality of nozzles being arranged in a second arrangement that has a first length along a second direction in a fourth plane that is substantially parallel with the first plane, and further wherein the source is movable along a path in the fourth plane, the path being unaligned with the second direction.

19. The system of claim 17 wherein the deposition region has a first area in the first plane, and wherein the source includes a first nozzle for emitting the plurality of vaporized atoms, and further wherein the source is movable within a fourth plane that is substantially parallel with the first plane.

20. The system of claim 17 wherein the frame is circular and the mounting surface is configured to impart a tension in the fourth major surface that it is directed radially from the center of the first opening.

21. The system of claim 17 wherein the plurality of pads is arranged radially about the first opening.

22. The system of claim 17 wherein the first chuck and second chuck are dimensioned and arranged to enable the first separation to be greater than 0 microns and equal to or less than 10 microns.

23. The system of claim 17 wherein the second chuck is operative for imparting a second attractive force on only the third major surface.

24. The system of claim 23 wherein the second attractive force is an electrostatic force.

25. The system of claim 23 wherein the second attractive force is selected from the group consisting of a vacuum-generated force and a magnetic force.

26. The system of claim 23 wherein each of the first attractive force and second attractive force is an electrostatic force.

27. The system of claim 23 wherein the second chuck includes a plurality of electrode pairs, wherein each electrode pair is disposed on the frame and is located between the frame and a different pad of the plurality of pads, the plurality of electrode pairs being configured to generate the second attractive force as an electrostatic force having a first magnitude that is controllable, and wherein a second magnitude of a tension induced in the fourth major surface is based on the first magnitude.

28. The system of claim 17 wherein the cross-section further defines an outer edge of the mounting surface that is distal to the first opening, and wherein the mounting surface and the outer edge meet at a second point in a fourth plane, and wherein the third plane is closer to the substrate than the fourth plane when the shadow mask and substrate are aligned.

29. The system of claim 17 wherein the second chuck is dimensioned and arranged such that it induces a curvature of the shadow mask in a direction opposite to gravity-induced sag of the shadow mask when the shadow mask is held in the second chuck.

30. The system of claim 17 wherein the membrane comprises silicon nitride.

* * * * *